US010331841B1

(12) United States Patent
Ginetti et al.

(10) Patent No.: US 10,331,841 B1
(45) Date of Patent: Jun. 25, 2019

(54) METHODS, SYSTEMS, AND COMPUTER PROGRAM PRODUCT FOR IMPLEMENTING VIRTUAL PROTOTYPING FOR ELECTRONIC DESIGNS

(71) Applicant: Cadence Design Systems, Inc., San Jose, CA (US)

(72) Inventors: Arnold Ginetti, Antibes (FR); Jean-Noel Pic, Valbonne (FR)

(73) Assignee: Cadence Design Systems, Inc., San Jose, CA (US)

( * ) Notice: Subject to any disclaimer, the term of this patent is extended or adjusted under 35 U.S.C. 154(b) by 81 days.

(21) Appl. No.: 14/997,239

(22) Filed: Jan. 15, 2016

(51) Int. Cl.
*G06F 17/50* (2006.01)

(52) U.S. Cl.
CPC ...... *G06F 17/5077* (2013.01); *G06F 17/5009* (2013.01); *G06F 17/5072* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 5,604,680 A | * | 2/1997 | Bamji | G06F 17/5068 716/118 |
| 6,170,080 B1 | * | 1/2001 | Ginetti | G06F 17/5045 716/104 |
| 6,378,116 B1 | | 4/2002 | Ginetti | |
| 6,405,345 B1 | | 6/2002 | Ginetti | |
| 6,519,743 B1 | | 2/2003 | Nauts et al. | |
| 6,622,290 B1 | | 9/2003 | Ginetti et al. | |
| 6,622,291 B1 | | 9/2003 | Ginetti | |
| 7,082,595 B1 | * | 7/2006 | Chan | G06F 17/5068 716/119 |
| 7,469,399 B2 | * | 12/2008 | Berry | G06F 17/5045 703/13 |
| 7,555,739 B1 | | 6/2009 | Ginetti et al. | |
| 7,634,743 B1 | | 12/2009 | Ginetti | |
| 7,900,174 B2 | * | 3/2011 | Shankar | G06F 17/5045 716/104 |

(Continued)

FOREIGN PATENT DOCUMENTS

WO   WO2009070177 A1   6/2009

OTHER PUBLICATIONS

J. Provence et al., "A Parallel Distributed Processing Approach to VLSI Global Routing," 1990 IEEE, pp. 283-286.*

(Continued)

*Primary Examiner* — Leigh M Garbowski
(74) *Attorney, Agent, or Firm* — Vista IP Law Group, LLP

(57) ABSTRACT

Disclosed are methods, systems, and articles of manufacture for implementing virtual prototyping for electronic designs. These techniques identify a plurality of leaf cells into a hierarchical physical design of an electronic design, generate the hierarchical physical design at least by performing hierarchical placement for the plurality of leaf cells based in part or in whole upon one or more factors, and revise the placed hierarchical physical design at least by performing hierarchical routing for the plurality of leaf cells on the hierarchical physical design. One aspect may further detach a virtual cell in the hierarchical physical design at least by grouping a first set of leaf cells and representing the first set of leaf cells with a first placeholder.

20 Claims, 21 Drawing Sheets

(56) References Cited

U.S. PATENT DOCUMENTS

| | | | |
|---|---|---|---|
| 7,937,682 B2 * | 5/2011 | Arunachalam | G06F 17/5072 716/118 |
| 7,949,987 B1 | 5/2011 | Ginetti et al. | |
| 7,970,596 B2 * | 6/2011 | Bade | G06F 17/5022 703/13 |
| 7,971,175 B2 | 6/2011 | Ginetti et al. | |
| 7,971,178 B1 | 6/2011 | Marwah et al. | |
| 8,046,730 B1 | 10/2011 | Ferguson et al. | |
| 8,136,062 B2 * | 3/2012 | Steinmetz | G06F 17/505 716/104 |
| 8,156,458 B2 * | 4/2012 | Baker | G06F 17/505 703/13 |
| 8,255,845 B2 | 8/2012 | Ginetti | |
| 8,266,571 B2 * | 9/2012 | Chapman | G06F 17/5045 716/107 |
| 8,281,272 B1 | 10/2012 | Ginetti | |
| 8,407,635 B2 * | 3/2013 | Chopra | G06F 17/504 703/16 |
| 8,453,136 B1 | 5/2013 | Hahn et al. | |
| 8,490,038 B1 | 7/2013 | Arora et al. | |
| 8,549,461 B2 * | 10/2013 | Huijbregts | G06F 17/505 703/16 |
| 8,594,988 B1 | 11/2013 | Spyrou et al. | |
| 8,719,754 B1 | 5/2014 | Ginetti | |
| 8,806,405 B2 | 8/2014 | Colwell et al. | |
| 8,910,100 B1 | 12/2014 | Wilson et al. | |
| 9,092,586 B1 | 7/2015 | Ginetti et al. | |
| 9,141,746 B1 | 9/2015 | Ginetti et al. | |
| 9,208,273 B1 | 12/2015 | Morlat et al. | |
| 9,223,915 B1 | 12/2015 | Ginetti et al. | |
| 2007/0245281 A1 * | 10/2007 | Riepe | G06F 17/5072 716/102 |
| 2010/0115207 A1 | 5/2010 | Arora et al. | |
| 2011/0061034 A1 | 3/2011 | Ginetti et al. | |
| 2011/0161899 A1 | 6/2011 | Ginetti et al. | |
| 2012/0047434 A1 | 2/2012 | Ginetti | |
| 2013/0246900 A1 | 9/2013 | Ginetti et al. | |
| 2013/0290834 A1 | 10/2013 | Ginetti et al. | |
| 2015/0339430 A1 * | 11/2015 | Nifong | G06F 17/5072 716/112 |

OTHER PUBLICATIONS

K. Sato et al., "MIRAGE—A Simple-Model Routing Program for the Hierachical Layout Design of IC Masks," no date, pp. 297-304.*

V.K. Sagar et al., "Parallel Hierarchical Routing for VLSI on a Transputer Network," no.date, pp. 6/1-6/4.*

M.S. Zamani et al., "A Stepwise Refinement Algorithm for Integrated Floorplanning, Placement and Routing of Hierarchical Designs," 1995 IEEE, pp. 49-52.*

M. Burstein et al., "Hierarchical Wire Routing," IEEE Trans. on Computer-Aided Design, vol. CAD-2, No. 4, Oct. 1983, pp. 223-234. (Year: 1983).*

C. L. Wardle et al., "A Declarative Design Approach for Combining Macrocells by Directed Placement and Constructive Routing," 21st Design Automation Conference, 1984 IEEE, pp. 594-601. (Year: 1984).*

Graeb, Helmut E., ed. *Analog layout synthesis: a survey of topological approaches.* Chapter 2, Hierarchical Placement with Layout Constralts, pp. 61-94, Springer Science & Business Media, 2010.

Wang, Laung-Terng, Yao-Wen Chang, and Kwang-Ting Tim Cheng, eds. Electronic design automation: synthesis, verification, and test. Morgan Kaufmann, 2009, pp. 687-749.

* cited by examiner

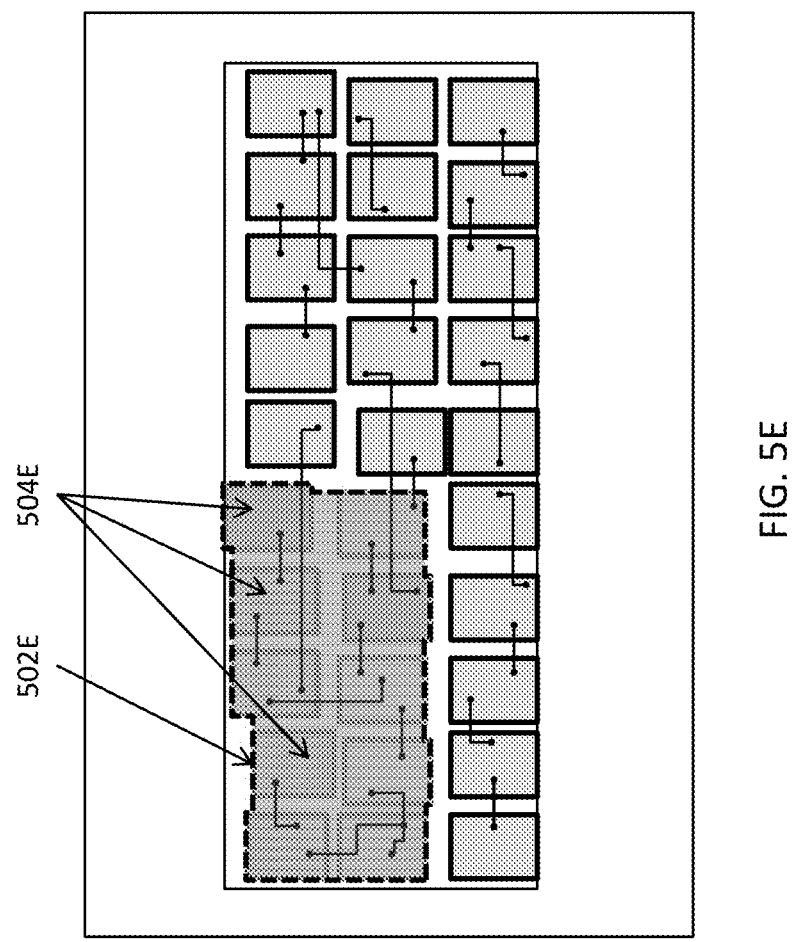

METHODS, SYSTEMS, AND COMPUTER PROGRAM PRODUCT FOR IMPLEMENTING VIRTUAL PROTOTYPING FOR ELECTRONIC DESIGNS

BACKGROUND

Conventional product development of integrated circuit (IC) designs involves computer-aided design (CAD) software to adopt a hierarchical approach to generate a floorplan or a tentative layout of its functional cells while the detailed physical designs of these functional cells or the IC design at the top hierarchical level may not have been designed or available and are usually distributed to a group of layout designers who collaborate to complete the entire layout of the integrated circuit.

Conventional prototyping approaches include a top-down and a bottom-up approach. A top-down approach begins the prototyping process at the top or highest hierarchy and proceeds to lower hierarchies until it reaches the lowest hierarchy to complete an IC design. With the top-down approach, the functional cells at a higher hierarchy may be brought into the layout canvas while each cell include its own pins, ports, or terminals (collectively pin for singular or pins for plural hereinafter). The details of these functional cells at lower hierarchies are not yet exposed and will be designed at respective lower hierarchies as the top-down approach migrates to lower hierarchies. A circuit designer needs to estimate the size of each cell and determine the locations of pins or terminals for the cell. The estimated cell may be too big to waste invaluable space on silicon or may be too small to accommodate all the devices therein. Either way, multiple iterations may be required for even a single cell. In addition, even if the circuit designer knows how these pins are connected to each other, the circuit designer may only align or offset these pins by manipulating the cell. In the event that a designer groups a set of components or cells and intends to create a logical cell for the set, the pins of the logical cell or their identifications thereof (e.g., names of the pins) have to be manually created. The designer will then have to find the corresponding pin identifications in the schematic design and associated these manually created identifications with the corresponding pin identifications.

Bottom-up approaches begin with the design of discrete circuit components and proceed to higher hierarchies as the designs of lower hierarchies are complete until the design for the top or highest hierarchy is complete. In these bottom-up approaches, pins and their identifications as well as locations are determined at lower hierarchies in their respective cells. At the higher level hierarchies, these pins often present a challenge to routing these pins of an actual or virtual cell because these pins are determined individually for each cell and independent of each other and may thus cause misalignment of pins or terminals at higher hierarchies where these cells are assembled and supposed to be interconnected. To rectify these problems such as pin or terminal misalignment at higher hierarchies, the design process must return to the lower hierarchies where the devices with the misaligned pins are placed, adjust the placement of the devices, and determine whether the pins or terminals are aligned at the next higher hierarchy. These conventional approaches must then proceed to the next higher hierarchy to determine whether there exist other misalignment problems. These conventional approaches may thus iterate multiple times until an acceptable or desirable solution is found.

Therefore, there exists a need for methods, systems, and computer program products for implementing virtual prototyping for electronic designs.

SUMMARY

Disclosed are method(s), system(s), and article(s) of manufacture for implementing virtual prototyping for electronic designs in one or more embodiments. Some embodiments are directed at a method for implementing virtual prototyping for electronic designs. In these embodiments, these described techniques identify a plurality of leaf cells into a hierarchical physical design of an electronic design, generate the hierarchical physical design at least by performing hierarchical placement for the plurality of leaf cells based in part or in whole upon one or more factors, and revise the placed hierarchical physical design at least by performing hierarchical routing for the plurality of leaf cells on the hierarchical physical design. In some of these embodiments, these techniques may further detach a real or virtual cell in the hierarchical physical design at least by grouping a first set of leaf cells and representing the first set of leaf cells with a first placeholder.

The one or more factors may include hierarchy information about a plurality of schematic hierarchies in a schematic design. In addition, a schematic design of the electronic design may be identified; connectivity information may be identified from the identified schematic design; and a plurality of schematic hierarchies and a plurality of schematic instances at one or more schematic hierarchies of the plurality of schematic hierarchies may be identified. In addition or in the alternative, a modification to be implemented to the hierarchical physical design may be identified; and a cell in which the modification is to be implemented in a real or virtual hierarchy may be identified. In some of these embodiments, the cell back may be embedded at a location of a placeholder for the cell in the hierarchical physical design; and one or more physical implementation modules may descend into the cell at the real or virtual hierarchy in the hierarchical physical design.

A modified cell may be generated at least by implementing the modification in the cell embedded into the hierarchical physical design, and the modified cell may be detached at least by representing the modified cell as the placeholder or a modified placeholder in some of these embodiments. In some embodiments, one or more physical design databases storing thereupon design data of the hierarchical physical design may be identified, generated, or updated; physical connectivity data and/or electrical parasitic information obtained from the hierarchical physical design and/or the one or more physical design databases may be appended to a hierarchical netlist and/or a flat netlist; and the hierarchical physical design may be analyzed by using at least the one of the one or more physical design databases and the hierarchical netlist as inputs to one or more simulation modules.

In addition or in the alternative, a set of constraints or design rules may be identified; a hierarchical data structure may be generated for the hierarchical placement for the plurality of leaf cells; and the hierarchical placement may be performed for the plurality of leaf cells by using at least the hierarchical data structure based in part or in whole upon the set of constraints or design rules. In some embodiments, a first schematic instance may be identified from schematic hierarchy information based in part or in whole upon one or more first criteria; and a first set of leaf cells corresponding to the first schematic instance and first connectivity information pertaining to the first schematic instance may also be identified from the plurality of leaf cells.

In some of these embodiments, a second schematic instance may be identified from schematic hierarchy information based in part or in whole upon one or more second criteria; a second set of leaf cells corresponding to the second schematic instance and second connectivity information pertaining to the first schematic instance may also be identified from the plurality of leaf cells; and the hierarchical placement may be performed for the first and second sets of leaf cells and for the plurality of leaf cells in the hierarchical physical design based in part or in whole upon the first connectivity information and the second connectivity information.

In some of these embodiments, the one or more first criteria include at least one of ranks, orders, or priorities of a plurality of schematic instances in a schematic design of the hierarchical physical design, a determination of whether the first schematic instance is connected to a power rail, a power stripe, or a ground rail, or any combinations thereof, and the one or more second criteria comprise at least one of a determination of whether the second schematic instance is connected to the first schematic instance, a number of connections between the first schematic instance and the second schematic instance, a distance between the first schematic instance and the second schematic instance, or any combinations thereof.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
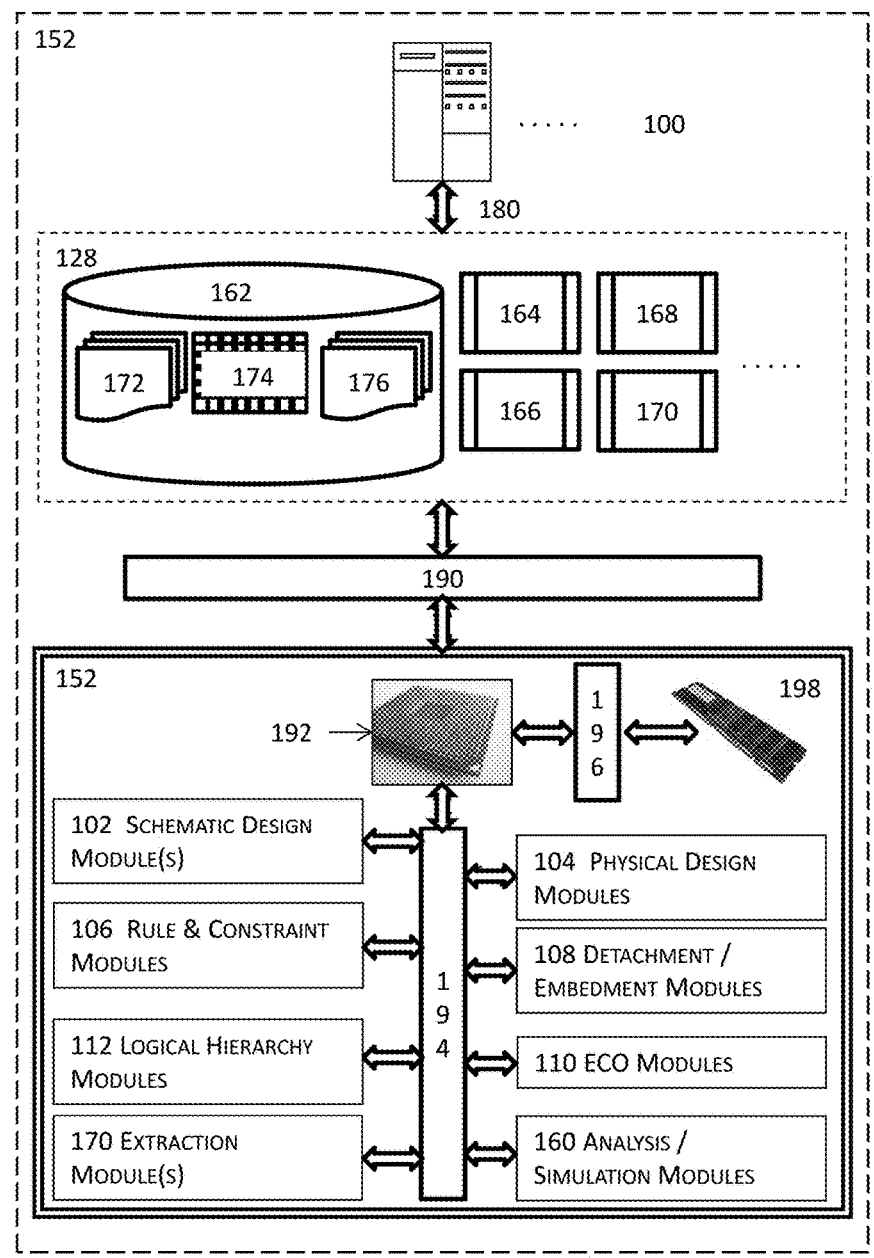
FIG. 1 illustrates a high level block diagram of a system for implementing virtual prototyping for electronic designs in one or more embodiments.

Various embodiments of the invention are directed to methods, systems, and articles of manufacture for implementing virtual prototyping for electronic designs. In various embodiments, the virtual prototyping invokes various modules (e.g., modules in a set of mechanisms or modules 152 of FIG. 1) to first receive inputs that may include, for example, the schematic design or a hierarchical level of the schematic design (e.g., the top level of the schematic design). These inputs may also include a plurality of leaf cells. Virtual prototyping may proceed to identify leaf cells into a physical design (e.g., a floorplan, a layout, etc.) of an electronic design. A leaf cell may comprise an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, leaf cells are situated at the lowest hierarchical level and do not contain any lower hierarchies in some embodiments.

In various embodiments described herein, a real hierarchy includes a hierarchical level in a physical electronic design (e.g., a floorplan, a layout, etc.) that corresponds to a schematic hierarchical level in the schematic design. A real hierarchy may thus be compared with a virtual hierarchy in the same physical electronic design. A virtual hierarchy includes a logical grouping or a cell of a set of physical circuit component designs or cells at a real hierarchy in a physical electronic design but finds no corresponding schematic hierarchy in the corresponding schematic design. A virtual hierarchy thus represents a logical partitioning of a physical electronic design or a portion thereof that belongs to a single real hierarchy into more than one logical hierarchy. For example, a set of circuit component designs in a real hierarchy may be grouped or partitioned into the first virtual hierarchy and the second virtual hierarchy under the real hierarchy such that the set in the physical electronic design is situated at the real hierarchy that further includes these two virtual hierarchies—the first and second virtual hierarchies.

It shall be noted that a cell in a physical electronic design includes, for example, an instance of a parameterized cell, an intellectual property cell, a macro cell, etc. It shall be further noted that a cell in a physical electronic design includes a grouping of circuit component designs in the physical electronic design. An instance of a real cell thus includes a cell that finds a corresponding cell instance in the corresponding schematic design, while a virtual cell instance comprises a grouping of circuit design components in a physical electronic design yet finds no corresponding schematic instance (without further processing the schematic design) or schematic hierarchy in the corresponding schematic design.

Information about the hierarchies in the corresponding schematic design may be identified. The schematic hierarchies may be used for the virtual prototyping so that the hierarchical structure of the schematic design may be observed and maintained in the generated physical design. Real hierarchies may be created in the physical design from these identified leaf cells by identifying one or more sets of leaf cells, each corresponding to a schematic instance of the corresponding schematic design, and further by generating respective real hierarchies for these one or more sets of leaf cells. With the generated real hierarchies, the boundary of a set of a plurality of leaf cells may also be determined. In addition to the real hierarchies, one or more virtual or logical hierarchies, as opposed to the real hierarchies corresponding to the schematic hierarchies, may be created by identifying a group of circuit component designs, cells, or any combinations thereof and further by generating a virtual or logical hierarchy for this identified group. Virtual or logical hierarchies may be used to break up a complex cell or a complex portion of a physical design into multiple smaller yet simpler portions.

These identified leaf cells may be placed in the physical design by using, for example, various placement techniques such as hierarchical placement techniques. These placement techniques may place the identified leaf cells and real cells situated at various real hierarchies and virtual hierarchies, if available, between real cells in some embodiments. In some of these embodiments, these placement techniques may also place the leaf cells or real sub-cell(s) at lower hierarchical level(s) with a physical cell.

Hierarchical routing may be performed between real cells at one or more real hierarchies. For example, routing may be performed between cells at the top or highest hierarchical level of the physical design. Any virtual cell thus generated may be detached from the physical design and stored as an object for future reuse and thus become a real cell. The physical design with a detached cell may include a place holder showing no or reduced design details and occupying the same space in the physical design. Various techniques described herein permit descending from a place holder into the corresponding detached virtual cell such that the design details may be shown in the same space occupied by the place holder in some embodiments or in a separate window in some other embodiments. The detached virtual cell becomes a real cell that may be embedded back into the physical design so that its place holder is now replaced with the design details of the detached virtual cell. Embedment of a detached virtual block may be used to implement modifications to the detached virtual block within the context of at least its surrounding design components.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1 illustrates a high level block diagram of a system for implementing virtual prototyping for electronic designs in one or more embodiments. In these one or more embodiments, FIG. 1 illustrates a high level block diagram of a hardware system and may comprise one or more computing systems 100, such as one or more general purpose computers described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a placement module, a global routing module, and/or a detail routing module 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes. The one or more databases 174 may further include a plurality of leaf cells (collectively a leaf cell for singular and leaf cells for plural). Leaf cells may include, for example, one or more standard cells, one or more library cells, one or more memory cells, one or more macro cells, or any combinations thereof. A leaf cell may be an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, leaf cells are situated at the lowest hierarchical level and do not contain any lower hierarchies.

In some embodiments, the one or more computing systems 100 may include or, either directly or indirectly through the various resources 128, invoke a set of mechanisms or modules 152 including hardware and software modules or combinations of one or more hardware and one or more software modules that are stored at least partially in computer memory may comprises one or more schematic design modules 102 to natively access or otherwise manipulate schematic designs of electronic designs. The set of modules 152 may further include one or more physical design modules 104 such as a floorplanner module to generate a floorplan for an electronic design, a hierarchical placement module to place leaf cells in a hierarchical physical design, a hierarchical routing module to perform various routing (e.g., global routing, detail routing, conduit routing, channel-routing, etc.) across and/or within each of multiple hierarchies in a hierarchical physical design.

The set of modules 152 may further optionally include one or more rule and constraint modules 106 to maintain and/or enforce various design constraints, design rules, and/or requirements (e.g., manufacturability requirements, reliability requirements, signal integrity requirements, etc.) In addition or in the alternative, the set of modules 152 may further include one or more detachment and embedment modules 108 to detach virtual or logical cells and to embed virtual or logical cells into a hierarchical physical design. In some embodiments, the set of modules 152 may further include one or more ECO modules 110 to function in conjunction with one or more other modules to implement various engineering change orders. For example, an ECO module function in conjunction with the schematic design module 102 or the physical design module 104 to identify a virtual cell in which the ECO is to be implemented, invoke the detachment and embedment module 108 to embed the detached virtual cell (which then becomes a real cell) into the hierarchical physical design of interest, invoke the physical design modules 104 and the rule and constraint module 106 to implement an ECO in the virtual cell, and to call the detachment and embedment module 108 to detach the modified virtual cell including the implemented ECO. The set of modules 152 may comprise one or more logical hierarchy modules 112 to manage (e.g., to create, to modify, to remove, to maintain, to manage, etc.) logical hierarchies.

In addition or in the alternative, the set of modules 152 may comprise one or more analysis and/or simulation modules 160 to analyze the hierarchical schematic design and/or the hierarchical physical design by directly utilizing the design databases as inputs for various simulations and/or analyses. The set of modules 152 may also include one or more extraction modules 180 to identify various data or information such as the schematic connectivity from a schematic design, physical design connectivity from a hierarchical physical design, parasitics from a hierarchical physical design, and/or hierarchy information from a hierarchical schematic design and/or a hierarchical physical design.

The set of modules 152 may further optionally include one or more signoff modules (not shown) to perform various signoff and design closure tasks to ensure that the electronic design implemented by various techniques described herein may be successfully fabricated while maintaining various performance, cost, reliability, and manufacturability requirements.

For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electromigration and IR-drop analyses, or other power and signal integrity analyses with SPICE-level accuracy or better accuracy with SPICE or SPICE-like simulations (e.g., Fast-SPICE, HSPICE, PSPICE, or any other SPICE-based or SPICE-compatible simulations) to ensure an electronic design meets or exceeds power, performance, and/or area goals in some embodiments.

The one or more signoff modules may include one or more physical verification modules (not shown) to perform various design rule checking, layout vs. schematic (LVS), etc. tasks to ensure that an electronic design meets or exceeds various spatial and other physical rules and one or more design for manufacturing (DFM) modules to address physical signoff and electrical variability optimization, correct lithography hotspots, predict silicon contours, improve yield, detect and repair timing and leakage hotspots to achieve variation- and manufacturing-aware signoff and design closure in some of these embodiments.

In addition or in the alternative, the one or more signoff modules may include one or more one or more computational lithography modules (not shown) to provide more accurate post-etch critical dimension accuracy and process windows on silicon, reticle and wafer synthesis, etc. to eliminate errors and/or reduce mask-manufacturing cycle times. One or more of these multi-fabric signoff modules may operate on the electronic design produced or modified with various techniques to be described in the following sections for proper signoff and design closure so that the signoff version of the electronic design may be properly manufactured with first-pass or fewer passes silicon success in some embodiments. In these embodiments, the signoff version of the electronic design produced or modified with various techniques described herein causes the underlying electronic circuit to be manufactured by a foundry or IC (integrated circuit) fabrication facility when the signoff version of the electronic design is forwarded to the foundry or IC fabrication facility that in turn fabricates the requisite photomasks and the eventual electronic circuit.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
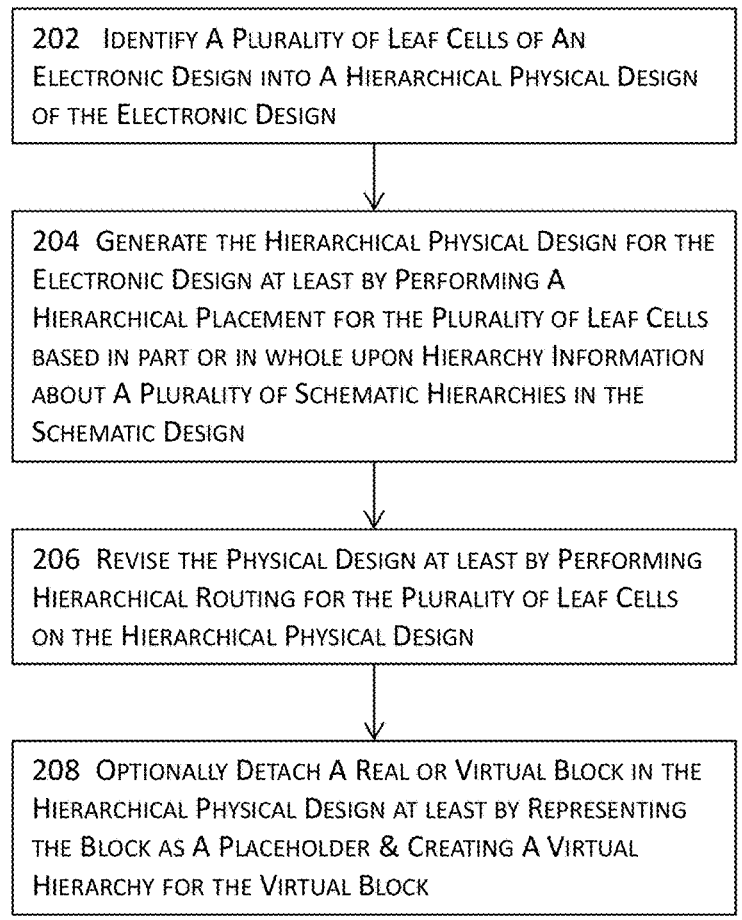
FIG. 2 illustrates a high level block diagram for implementing virtual prototyping for electronic designs in one or more embodiments.

FIG. 2 illustrates a high level block diagram for implementing virtual prototyping for electronic designs in one or more embodiments. In these one or more embodiments, a plurality of leaf cells for an electronic design may be identified at 202 into a hierarchical physical design. A leaf cell may be an object of a class in the paradigm of object oriented programming and may thus be instantiated into multiple instances to create at least a portion of a hierarchical physical design (e.g., a floorplan, a layout, etc.) or to create a larger and/or more complex cell in some embodiments. In the real hierarchy structure of a hierarchical physical design, leaf cells are situated at the lowest hierarchical level and do not contain any lower hierarchies.

A leaf cell may be identified from a library or set of leaf cells where the library or set may include, for example, standard cells, IP (intellectual property) cells, macro cells, one or more cells designed or used in prior designs, etc. and may be established from one or more prior designs in some embodiments. In some embodiments where an existing leaf cell is unavailable (e.g., a new cell that has not been used before) for a set of circuit component designs, such a leaf cell may be identified by referencing one or more prior similar cells that exhibit similar functions and/or structures and may be modified to form the leaf cell of interest in some embodiments. In some other embodiments, an unavailable leaf cell may be identified by estimating the size, shape, and/or the number and locations of connections based in part or in whole upon the pertinent connectivity information of this unavailable leaf cell with respect to one or more other leaf cells or circuit component designs.

The leaf cells may be identified in different ways in different embodiments. For example, a schematic instance schematic may be identified from the schematic hierarchy information, and all leaf cells corresponding to the schematic instance at a schematic hierarchical level may then be identified into the hierarchical physical design such that these leaf cells may correspond to a real cell that in turn corresponds to the schematic by parsing the corresponding schematic design in any order. The other sets of leaf cells respectively corresponding to the remaining schematic instances at this schematic hierarchical level may further be identified into the hierarchical physical design to create the corresponding physical cells.

A real hierarchy may then be created for these physical cells. In these embodiments, the real hierarchy of the hierarchical physical design corresponds to the schematic level of the schematic design so that the schematic hierarchies are preserved in the hierarchical physical design. Other ways of identifying leaf cells into a hierarchical physical design may also be used. For example, all leaf cells corresponding to a schematic design may be aggregated into a physical design first, and the schematic hierarchical structure may be populated into and hence turn the physical design into a hierarchical physical design by grouping leaf cells corresponding to each schematic instance at a schematic hierarchy to form a physical cell and further by grouping physical cells corresponding to the same schematic hierarchy into a higher level real hierarchy until the highest hierarchical level is reached.

The hierarchical physical design for the electronic design may be generated at 204 at least by performing a hierarchical placement for the plurality of leaf cells based in part or in whole upon the hierarchy information about a plurality of schematic hierarchies in the corresponding schematic design. In some embodiments, hierarchical placement is performed after all the leaf cells have been identified into the physical design.

In some embodiments where cells at one or more real hierarches have already been created at 202, hierarchical placement may be performed at 204 between physical cells as well as within each of the physical cells in the hierarchical physical design. Hierarchical placement may be performed based in part or in whole upon a set of one or more constraints, design rules, and/or requirements. More details about hierarchical placement will be described below with reference to FIGS. 4A-C.

The hierarchical physical design may be revised or further implemented at 206 at least by performing hierarchical routing for the plurality of leaf cells on the hierarchical physical design. In some embodiments where real cells and/or real hierarchies have been identified for the leaf cells identified at 202, hierarchical routing may be performed at one or more real hierarchies. For example, hierarchical routing may be performed between the real cells at the highest real hierarchy and also between these real cells and the power and ground rails or stripes in some embodiments. More details about hierarchical routing will be described below with reference to FIG. 4D. Hierarchical placement and/or hierarchical routing may be repeatedly performed in multiple iterations to improve or optimize the hierarchical physical design with respect to one or more goals or objectives although the number of iterations is much smaller than conventional approaches.

One of the advantages of these virtual prototyping techniques is that hierarchical routing is performed after hierarchical placement and prior to detachment so that pin locations for one real cell are determined in view of one or more other real cells. These virtual prototyping techniques are in sharp contrast with conventional bottom-up approaches where pin locations for real cells are determined for each real cell individually and independent of each other. These pin locations determined with conventional bottom-up approaches thus present a much greater risk of pin misalignment.

These virtual prototyping techniques are also in sharp contrast with conventional top-down approaches where pin locations are determined for cells situated at the higher (or highest) hierarchical level first without reference to design details at lower hierarchical levels. Although pin misalignment issues may be reduced with these conventional top-down approaches, these conventional top-down approaches may nevertheless run into other issues that a higher level cell may not include sufficiently large real estate to accommodate design details at lower hierarchies simply due to the fact that a higher hierarchical level is implemented without referencing design data at lower hierarchical levels. Whenever a fit issue arises, conventional top-down approaches must perform one or more additional iterations from the highest hierarchical level until a feasible solution is found. As a result, these virtual prototyping techniques described herein require a fewer number of iterations and thus conserve more computing resources (e.g., runtime) when compared to both conventional top-down and bottom-up approaches.

A virtual cell may be optionally detached at 208 in the hierarchical physical design at least by representing the virtual cell as a placeholder that shows no design details until descended into. In some embodiments where a virtual cell is detached from the hierarchical physical design, a virtual or logical hierarchy may be created at 208. This virtual or logical hierarchy is created to represent the grouping of design components in the virtual cell and does not affect the actual real or schematic hierarchical structure of the electronic design. A more complex cell may be further detached into a plurality of virtual or logical sub-cells in some embodiments. For example, a single cell may be overly complex for a single designer to implement. In this example, the single cell may be further detached into multiple smaller virtual or logical sub-cells such that these multiple smaller sub-cells may be distributed among multiple designers for implementation.

Figure 5A:
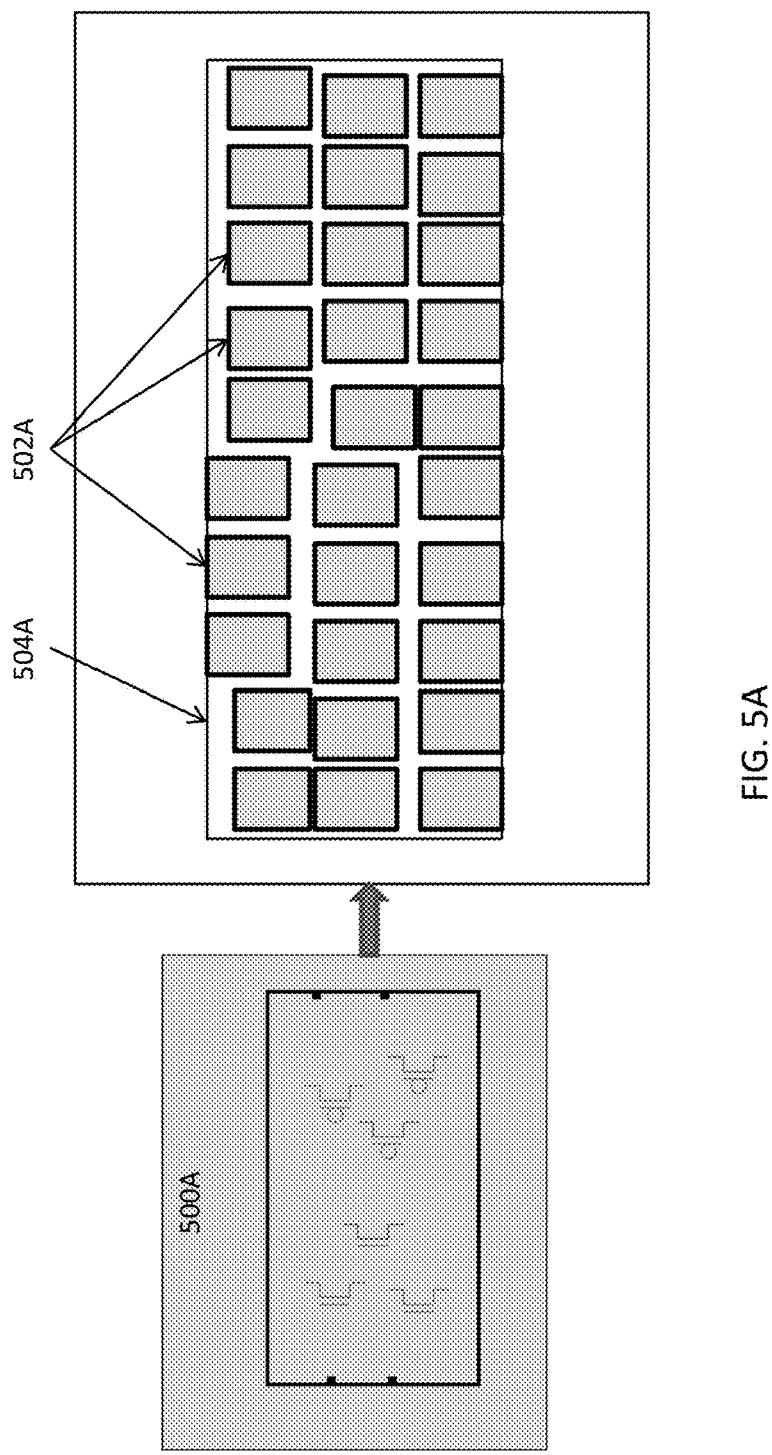
FIG. 5A illustrates an example of hierarchical placement of leaf cells with various techniques described herein in one or more embodiments.
Figure 5B:
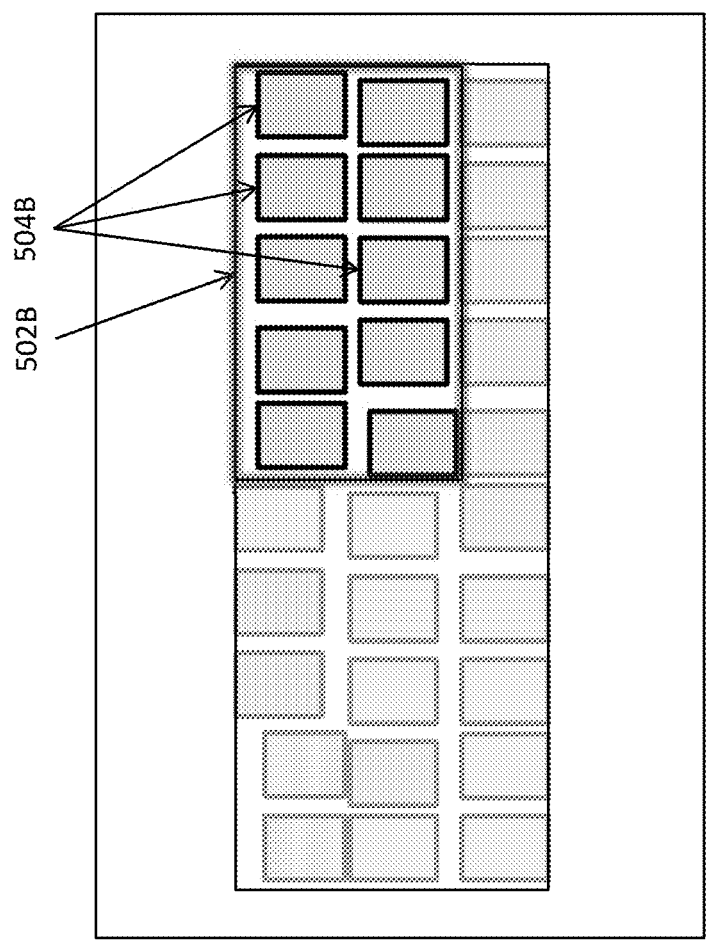
FIG. 5B illustrates an example where the hierarchical physical design illustrated in FIG. 5A is implemented while observing and maintaining the schematic hierarchies in one or more embodiments.
Figure 5C:
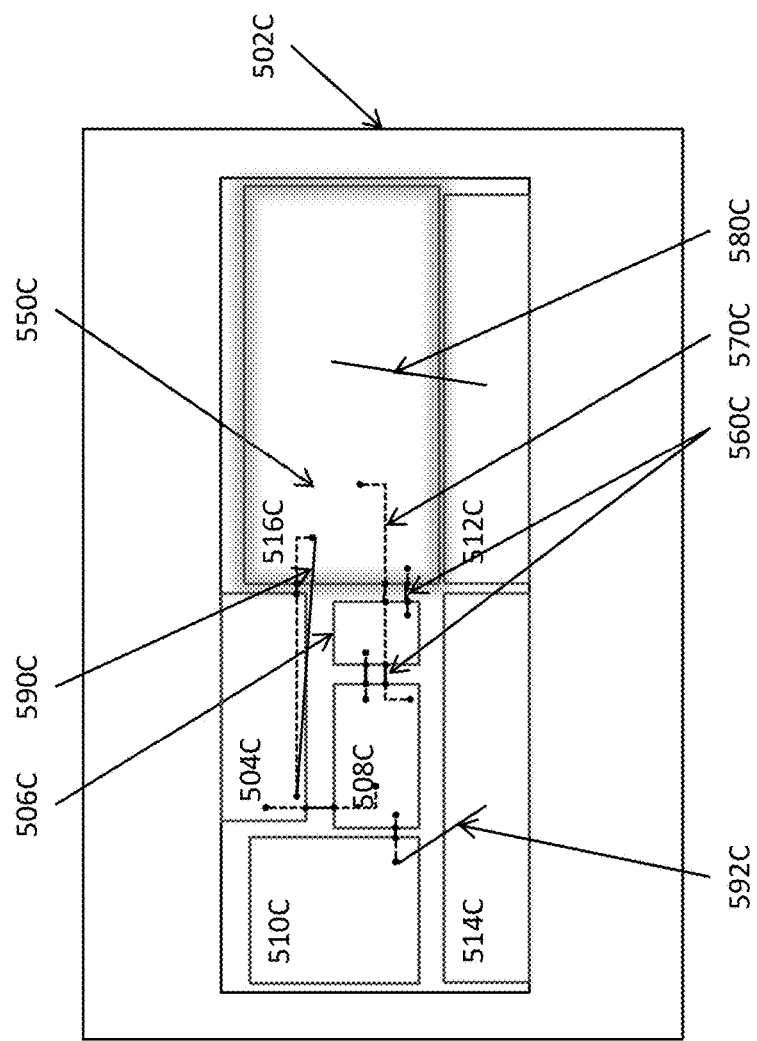
FIG. 5C illustrates an example of the hierarchical physical design illustrated in FIGS. 5A-B with the logical hierarchies detached and at least some hierarchical routing results between the virtual hierarchies in one or more embodiments.
Figure 5D:
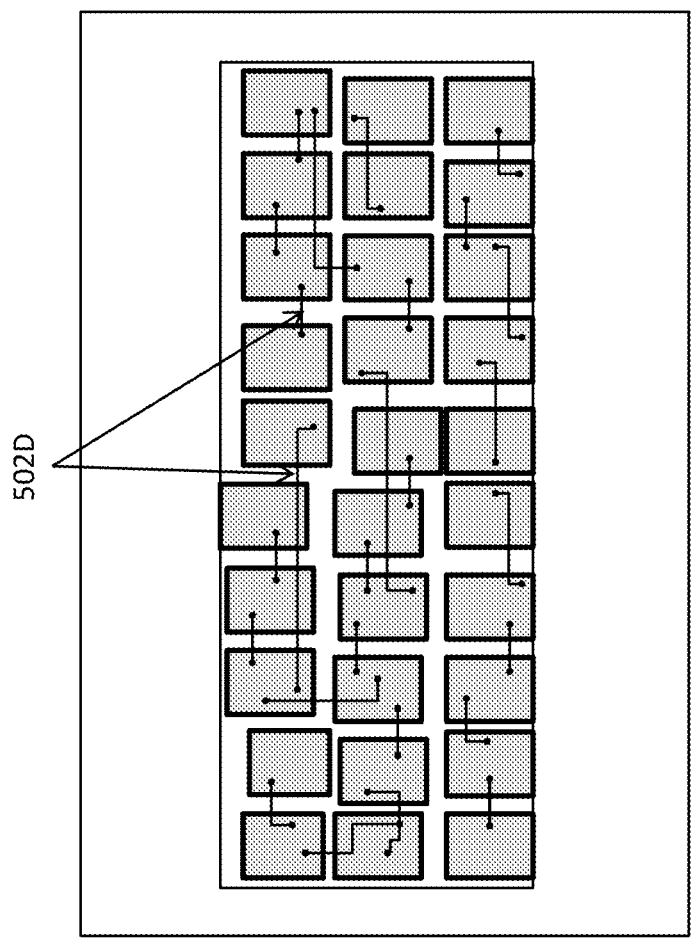
FIG. 5D illustrates an example of the hierarchical physical design illustrated in FIGS. 5A-B with at least some hierarchical routing results in one or more embodiments.
Figure 5F:
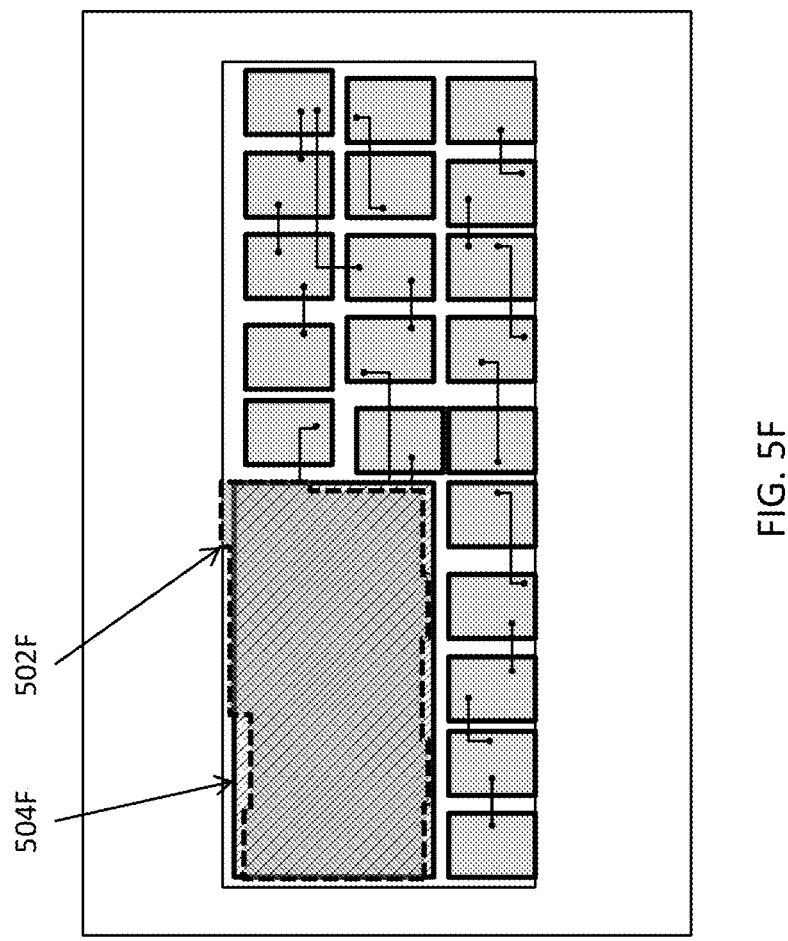
FIG. 5F illustrates an example of virtual cell detachment in one or more embodiments.
Figure 5G:
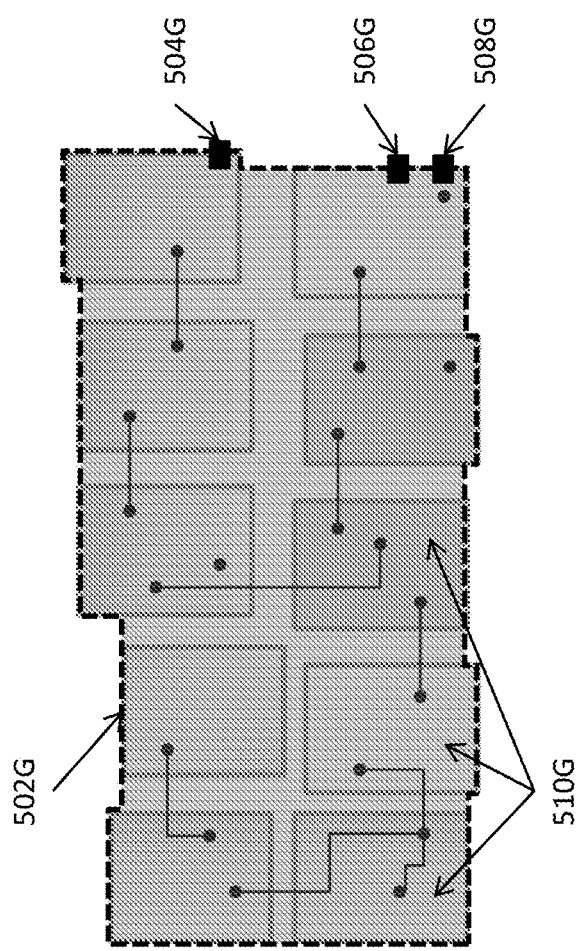
FIG. 5G illustrates the detached virtual cell in a virtual or logical hierarchy in one or more embodiments.
Figure 5H:
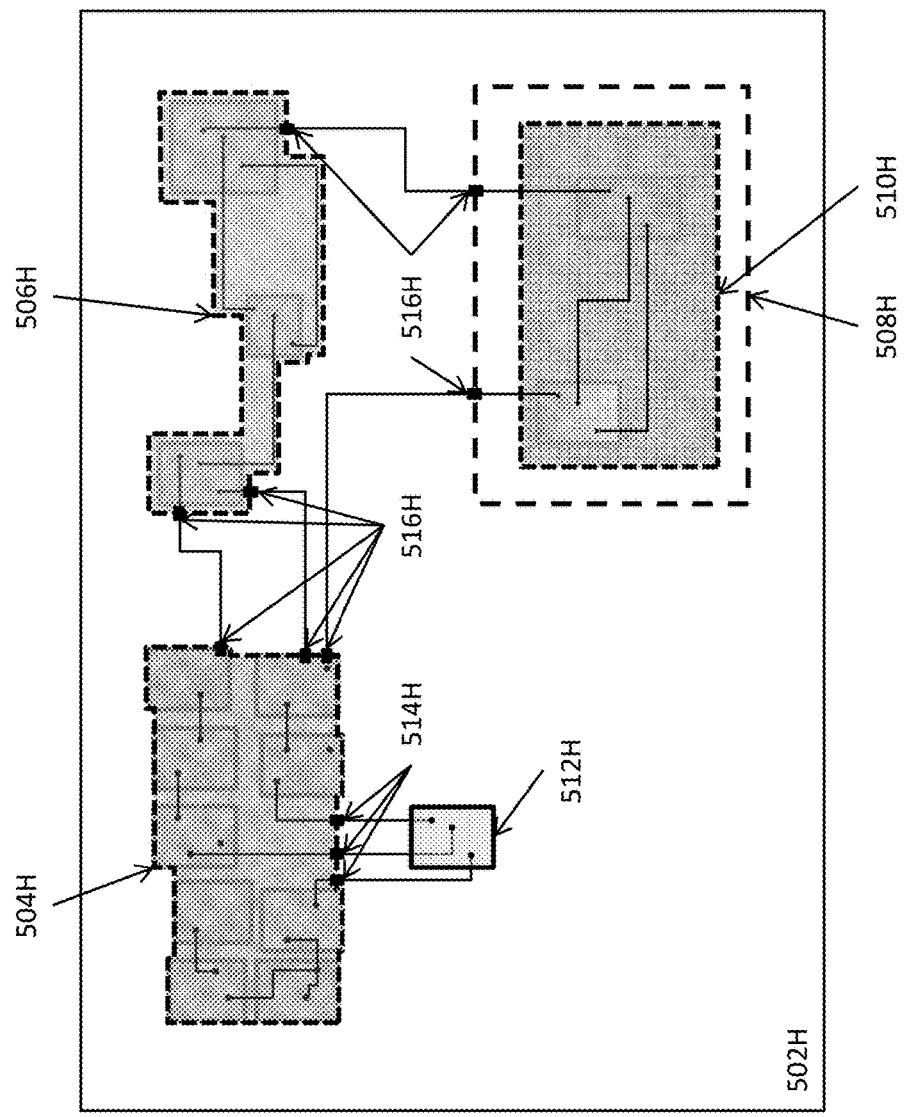
FIG. 5H illustrates an implementation of an ECO in a hierarchical physical design in one or more embodiments.
Figure 51:
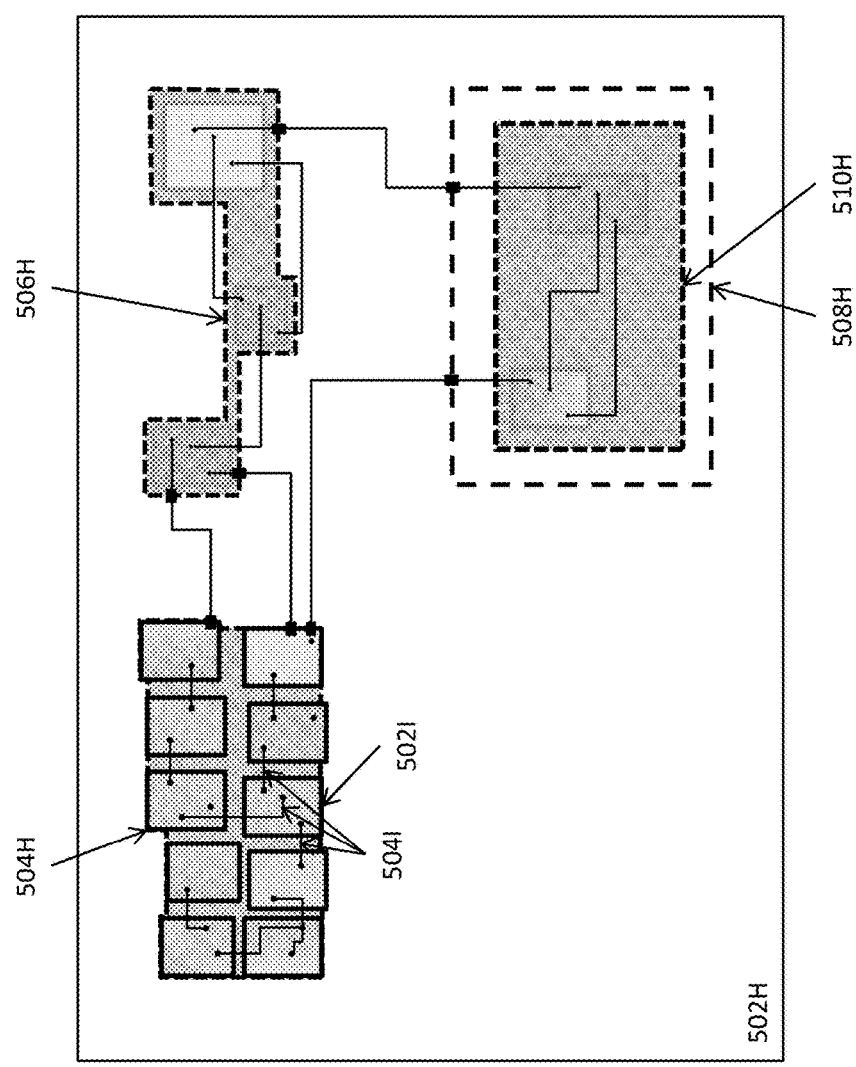
Figure 5J:
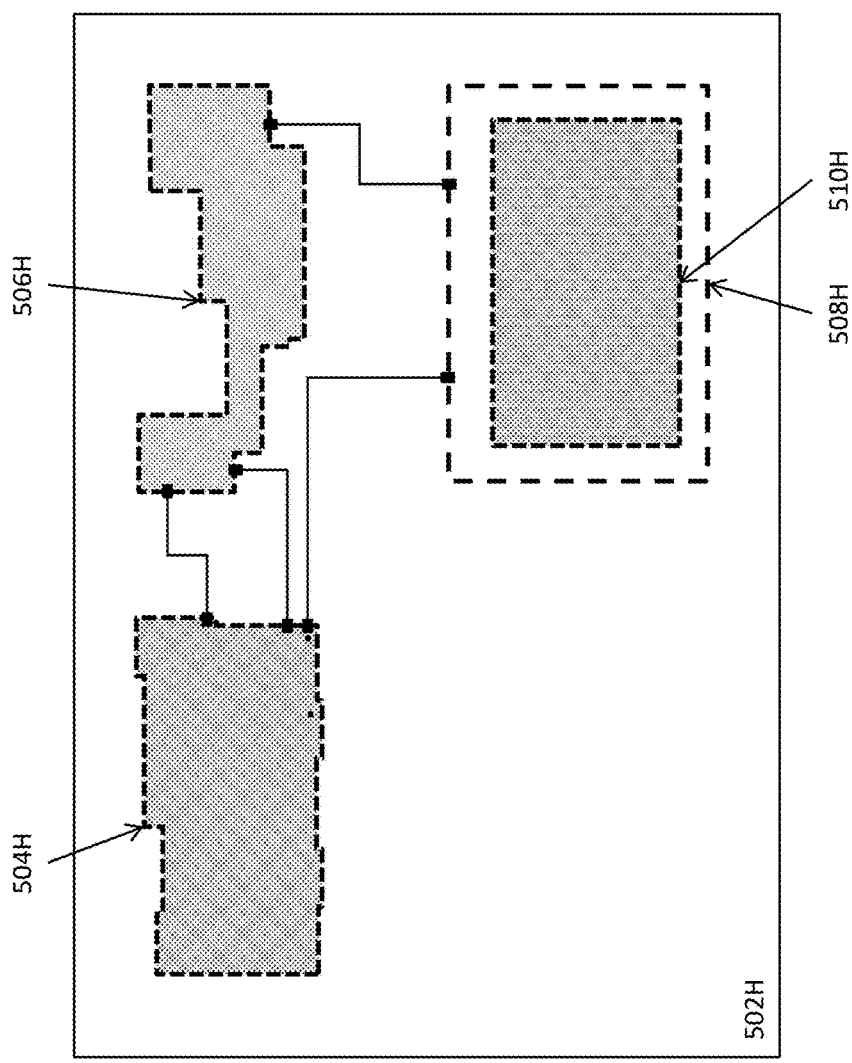
FIG. 5E illustrates an example of automatic boundary generation for a virtual or logical hierarchy in one or more embodiments.
FIG. 5I illustrates another implementation of the same ECO process illustrated in FIG. 5H by using various techniques described herein in one or more embodiments.
FIG. 5K illustrates an example of an analysis view showing hierarchical connectivity analysis for the hierarchical physical design illustrated in FIGS. 5A-B in one or more embodiments.
FIG. 5L illustrates an example of detaching a plurality of sub-blocks from a detached cell in some embodiments.
Figure 5K:
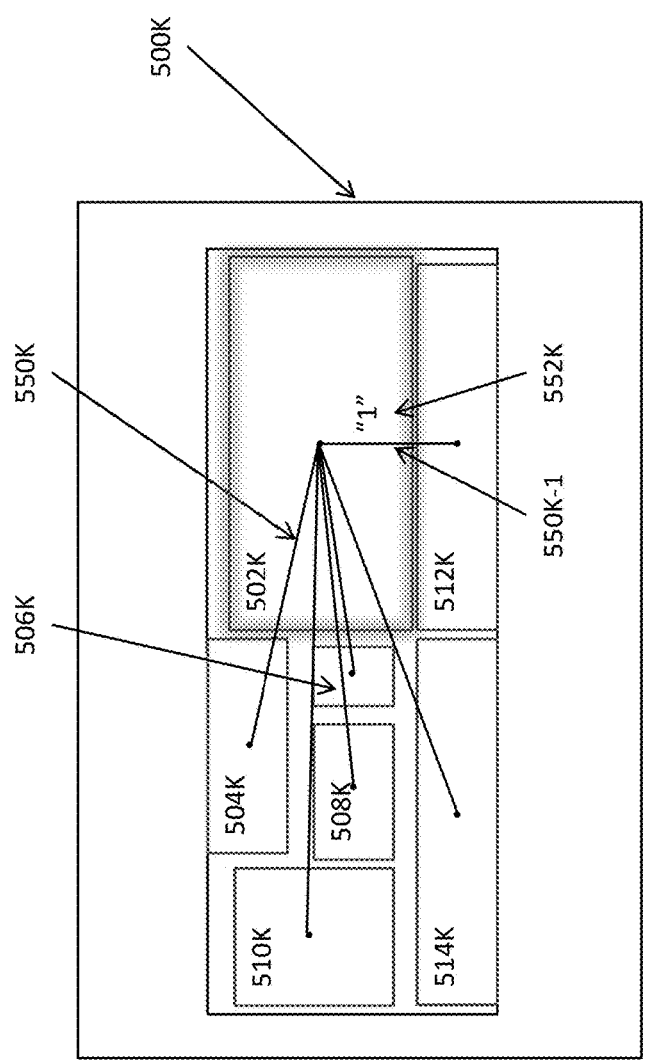
Figure 5L:
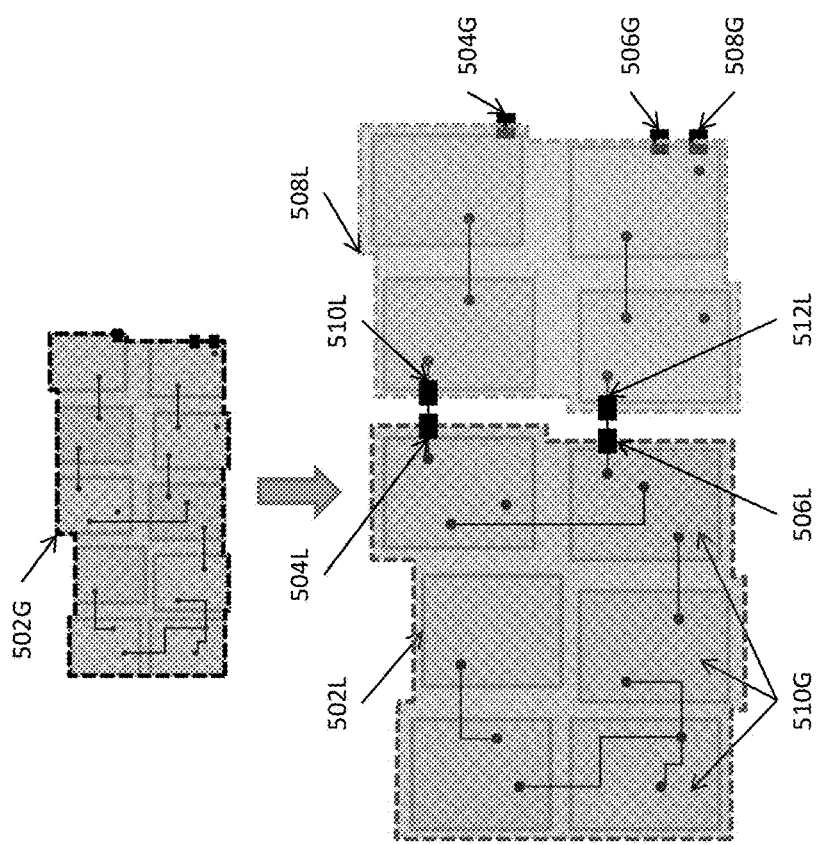

In the example illustrated in FIG. 5L, a detached cell 502G as shown in FIG. 5G may be further detached into a first virtual cell 502L and a second virtual cell 508L having their respective boundaries. The first virtual or logical cell 502L may include two optional pins or terminals 504L and 506L along the boundary of the virtual or logical cell 502L. Similarly, the second virtual or logical cell 508L may include two optional pins or terminals 510L and 512L as well as the original pins or terminals 504G, 506H, and 508G along the boundary of the virtual or logical cell 508L.

In some of these embodiments where the virtual cell is detached and becomes a real cell, the real cell may be stored as a master cell. A root device corresponding to the master cell may be identified, and device correspondence may be determined based in part or in whole upon one or more searches or queries may be performed for the other leaf cells in the hierarchical physical design with respect to the identified root device based in part or in whole upon one or more criteria. For example, these one or more searches or queries may include placement queries that evaluate one or more predicates with respect to one or more criteria to retrieve placement or device information from one or more databases including design data of a schematic or a hierarchical physical design of an electronic design of interest. A determination may then be made to decide whether the device correspondence represents a clone or a mutant based in part upon one or more search criterion. In these embodiments, the placed leaf cells may be quickly and efficiently categorized or grouped into their respective instances at corresponding hierarchies. More details about these techniques are described in U.S. patent application Ser. No. 14/503,409 filed on Oct. 1, 2014 and entitled "METHODS, SYSTEMS, AND ARTICLES OF MANUFACTURE FOR IMPLEMENTING CLONE DESIGN COMPONENTS IN AN ELECTRONIC DESIGN". The contents of the aforementioned U.S. patent application are hereby expressly incorporated by reference in its entirety for all purposes.

The boundary for a cell (e.g., a real cell or a virtual cell) may also be determined by tracing the outermost edges of the designs of sub-cells or components in the cell in some embodiments or by offsetting the outermost edges of the designs of sub-cells or components by a uniform or variable margin (e.g., increasing margins to accommodate the parallel run-length design rule) in some other embodiments.

The boundary of a virtual cell may be determined based in part or in whole upon one or more constraints or design rules such as a minimum spacing requirement between edges of components and the boundary, a minimum cost requirement that requires a fewer number of bends along the boundary or a more uniform boundary, a maximum performance requirement, etc. A boundary of a cell determined at 208 may or may not be the final boundary of the final design of the cell when the physical design of this cell is complete. Therefore, a boundary generated at 208 may include an exact boundary or an approximate boundary of the block or cell in the physical domain. Furthermore, the boundary may be generated for a virtual cell as described herein prior to the detachment of the virtual cell with the generated boundary such that the boundary may be further tweaked or fine-tuned by a designer or by an automated process before the virtual cell is detached in some embodiments.

An advantage of these techniques described herein is that a boundary is generated with the actual designs of the devices or circuit component designs, to the extent that the actual designs of the devices or circuit component designs are available, and may thus present a constraint for a layout designer to further implement the detail design of the cell in the physical design paradigm. The generation of cell boundary with actual designs of cells or components in virtual prototyping is in sharp contrast with conventional approaches where design details are generally not considered, at least at the higher hierarchical levels. These conventional approaches may thus result in much less accurate boundaries for these higher hierarchical level cells and hence more iterations than the virtual prototyping techniques described herein to reach an acceptable or desirable solution.

In some embodiments, pin locations for a detached virtual cell may also be determined at 208 from the boundary and the hierarchical routing results. For example, a pin may be inserted along the cell interface at the intersection of the boundary and an interconnect that is determined by hierarchical routing. As the hierarchical routing may be performed based in part upon the schematic connectivity information, the identification of this pin may also be determined from the schematic connectivity information, instead of being manually created and must be subsequently linked to or associated with the schematic connectivity. For example, a pin in the physical domain may be generated with an identification that references the identification of the corresponding pin in the pin-out in the schematic domain, the identification of the corresponding schematic device, and/or the identification of the net connected to the pin in some embodiments.

As described above with reference to the boundary, the pin locations generated at 208 may also be exact locations in some embodiments and/or approximate locations in some other embodiments because the boundary generated at 208 may be exact or approximate. Even when the pin locations are approximate, a detached virtual cell may nevertheless have a much better chance of fitting into a higher hierarchical level design and may also present a much easier design for subsequent physical implementation because the boundary and the pin locations of a cell are both generated by considering as much actual device geometries as possible during the prototyping stage. As a result, relatively larger deviations of a cell boundary or pin locations from those generated at 208 are thus unlikely, whereas relatively smaller deviations may be accommodated in subsequent implementations with less intensive computations, shorter runtime, and shorter design cycle time because most deviations, if any, occur in close proximity of their nominal designs in the prototype developed with various techniques described herein and may thus be corrected with ease.

Figure 3A:
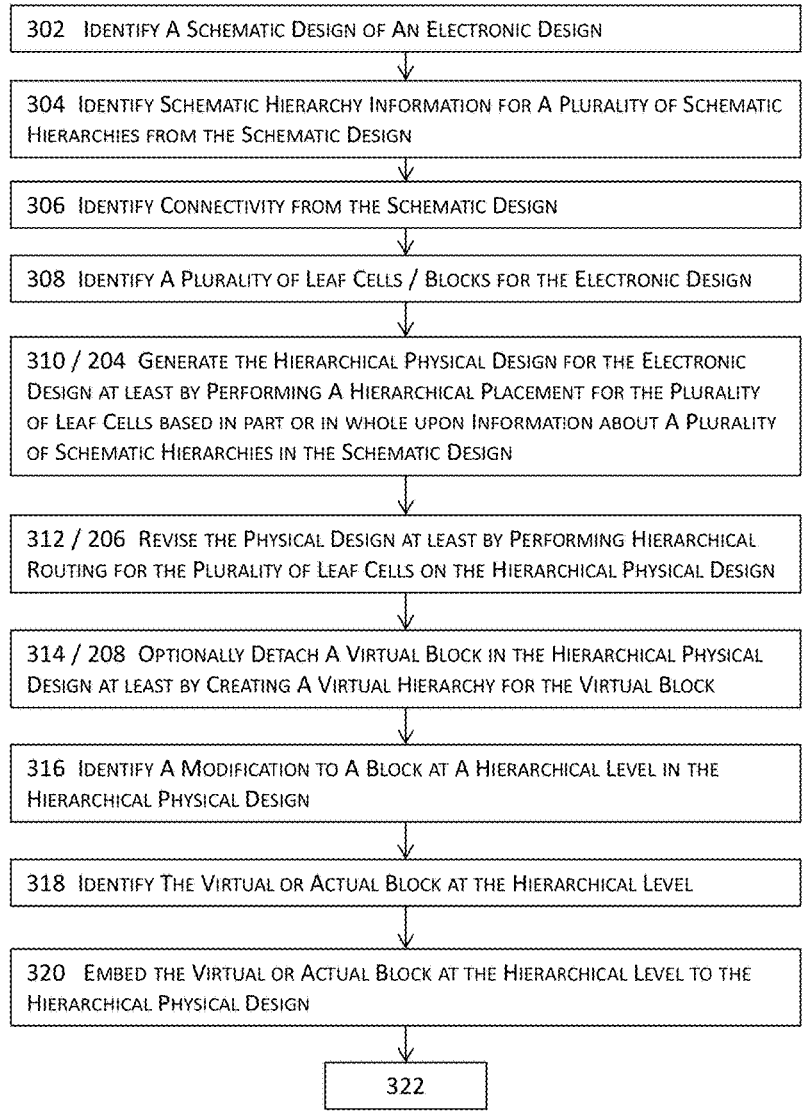
FIGS. 3A-B jointly illustrate a more detailed block diagram for implementing virtual prototyping for electronic designs in one or more embodiments.
Figure 3B:
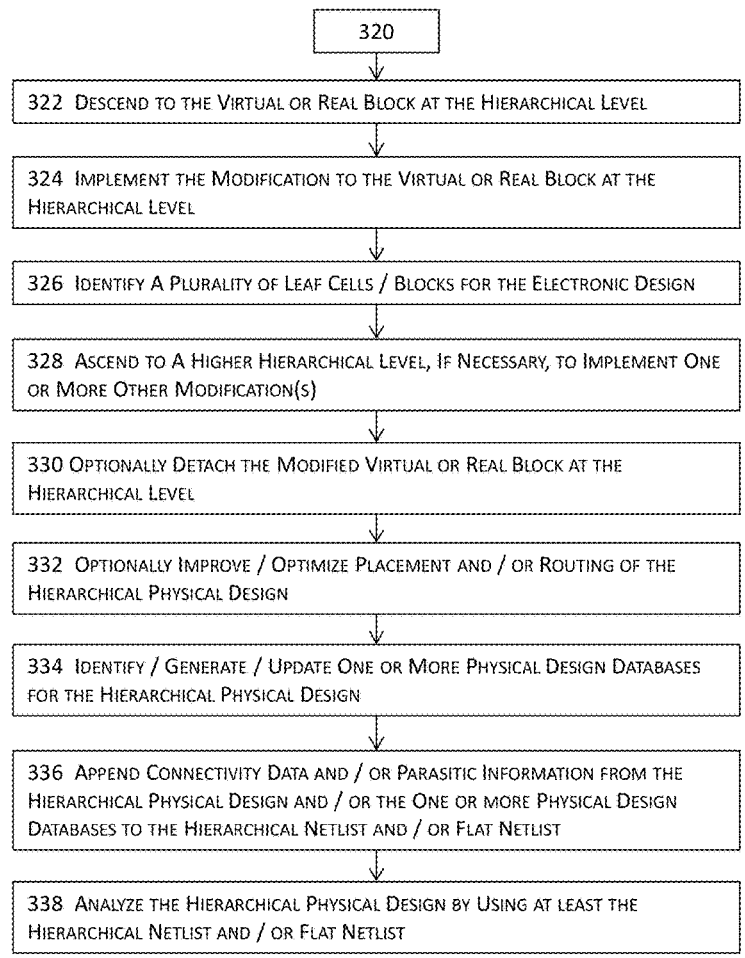

FIGS. 3A-B jointly illustrate a more detailed block diagram for implementing virtual prototyping for electronic designs in one or more embodiments. In these one or more embodiments, these virtual prototyping techniques described herein preserved the plurality of schematic hierarchies in the automatic generation of a physical design (e.g., a floorplan, a layout, etc.) As a result, a schematic design of an electronic design may be identified at 302. Schematic hierarchy information for a plurality of schematic hierarchies may be identified at 304 from the identified schematic design. the schematic hierarchy information is to be maintained or preserved during the automatic generation of a physical design. In the example illustrated in FIG. 5A, a schematic design 500A may be identified for the automatic creation of a corresponding hierarchical physical design (reference numeral 504A in FIG. 5A). A plurality of leaf cells 502A may be identified from, for example, a set, a library, or a database of leaf cells into the hierarchical physical design 504A. The boundary 504A may also represent the placement and boundary of the hierarchical physical design.

Connectivity information may also be identified at 306; and a plurality of leaf cells may be identified at 308 from, for example, a set or library of leaf cells. The connectivity information may be used to guide the placement and/or the routing of leaf cells and may also be used in detaching a virtual cell (e.g., generating an identification of a pin for the virtual cell) in some embodiments. It shall be noted that this application does not explicitly distinguish a cell and an instance of a cell for the ease of description and explanation. Nonetheless, it shall be understood that when certain portions of the application describe that a cell is identified or inserted into a design, it is an instance of the cell that is identified or identified into the design, and that multiple instances of the same cell may be identified or inserted into the same design.

A hierarchical physical design may be generated at 310 for the electronic design at least by performing a hierarchical placement for the plurality of leaf cells based in part or in whole upon schematic hierarchy information about the plurality of schematic hierarchies identified at 304 from the schematic design. In the example illustrated in FIG. 5A, the plurality of leaf cells 502A represent a result of such hierarchical placement. More details about hierarchical placement of a plurality of leaf cells will be described below with reference to FIGS. 4A-C. The hierarchical physical design may be further implemented or revised at least by performing hierarchical routing at 312 on the hierarchical physical design for the plurality of leaf cells. FIG. 5D illustrates a result of hierarchical routing with a plurality of interconnects 502D between various leaf cells 502A for the hierarchical physical design 504A illustrated in FIG. 5A. More details about performing hierarchical routing on a hierarchical physical design for a plurality of leaf cells will be described below with reference to FIG. 4D.

A virtual cell may be optionally detached at 314 at least by representing the virtual cell as a placeholder while de-emphasizing or hiding the design details of the virtual cell. It shall be noted that the virtual cell refers to an instance of the virtual cell object that is instantiated at the location occupied by the extent of the virtual cell in the hierarchical physical design but will be referred to as the virtual cell for the simplicity and ease of explanation and description. Once a virtual cell is detached, the detached virtual cell may be stored as a cell object that may be further instantiated into a plurality of instances in the same or different hierarchical physical designs. In some embodiments where a virtual cell is detached from the hierarchical physical design, a virtual or logical hierarchy may also be created for this virtual cell without affecting the schematic hierarchical structure represented by the schematic hierarchy information. The virtual cell corresponds to a schematic instance at a schematic hierarchy. Therefore, this created virtual or logical hierarchy corresponds to the schematic hierarchy of the schematic instance in some embodiments. Once a virtual cell is detached, the virtual cell becomes a real cell in the hierarchical physical design, and the virtual or logical hierarchy becomes a real hierarchy in the hierarchical physical design. The boundary and/or the identifications or locations of one or more pins of a detached cell may also be generated in an identical or substantially similar manner as those described above with reference to reference numeral 208 of FIG. 2.

In the example illustrated in FIG. 5B, a group of leaf cells 504B may be identified from the plurality of leaf cells 502A according to a schematic instance in the schematic hierarchy information of the identified schematic design (500A). A virtual cell 502B may be created to encompass this group of leaf cells 504B. This virtual cell 502B may be subsequently detached from the hierarchical physical design in identical or substantially similar manners described above. The same detachment process may be performed on one or more other virtual cells. In the example illustrated in FIG. 5C, seven virtual cells, 502C, 504C, 506C, 508C, 510C, 512C, and 514C, have been detached from the hierarchical physical design 502C to become corresponding real cells in the physical design.

FIG. 5C further illustrates that a virtual cell 516C in a region or cell 502C of an electronic design may be identified for further processing (e.g., connectivity analysis), and the identified virtual cell 516C may be highlighted as shown in 550C to indicate that this virtual cell 516C has been identified. In the example illustrated in FIG. 5C, the virtual cell 516C has not yet been detached to become a real cell. Furthermore, the leaf cells (e.g., 504B in FIG. 5B) are not shown in the representation of the virtual cell 516C in FIG. 5C. Rather, FIG. 5C illustrates a plurality of virtual cells (504C, 506C, 508C, 510C, 512C, 514C, and 516C) in 502C before these virtual cells are detached. Further processing of a virtual block or cell may include, for example, one or more connectivity analyses, electrical simulations of the hierarchical physical design or a portion thereof, any other analyses or simulations, or any combinations thereof.

For example, FIG. 5K illustrates an example of an analysis view showing hierarchical connectivity analysis for the hierarchical physical design illustrated in FIGS. 5A-C in one or more embodiments. The hierarchical physical design 500K illustrated in FIG. 5K includes the same seven instances, 502K, 504K, 506K, 508K, 510K, 512K, and 514K, as similarly shown in FIG. 5C. In FIG. 5C, instance 502K has been identified and shown as highlighted for a connectivity analysis. Various techniques described herein may issue a function call to, for example, one or more analysis or simulation modules 160 to analyze the connectivity for the identified instance 502K.

These one or more analysis or simulation modules 160 may examine the physical connectivity information from the hierarchical physical design and/or the schematic connectivity information in the corresponding schematic design, verify that the physical connectivity information matches the schematic connectivity information, flag any inconsistencies (if any) for correction or repair, and display the connectivity information for the identified instance 502K. In this example illustrated in FIG. 5K, a set of flight lines 550K may be generated between the identified instance 502K and the other connected instances.

It shall be noted that these flight lines may include straight line segments in some embodiments or jagged line segments each having one or more bends that mimic approximately or exactly the actual interconnections between these interconnected instances in some other embodiments. Each of the flight lines may be associated or annotated with additional connectivity information including, for example, the number of connections, the net identifications or names, the pin or terminal identifications or names, any other information of interest, or any combinations thereof. For example, the flight line 550K-1 is annotated with "1" (552K) indicating there is one ("1") connection between instance 502K and instance 512K.

Referring back to FIG. 5C that also illustrates some connectivity information between some of the virtual blocks. The connectivity information may include, for example, straight flight-lines (e.g., 580C and 590C), jagged flight-lines (e.g., 560C and 570C), or any combinations thereof. A straight flight-line may be shown between two virtual cells by drawing a straight flight-line segment (e.g., 580C) with the beginning and end points at any locations in these two virtual cells in some embodiments. In some other embodiments, a straight flight-line segment (e.g., 590C) may be drawn from an approximate or an exact location of a pin in one virtual cell to another approximate or another exact location of another pin in another cell in some other embodiments. Yet in some other embodiments, a straight flight-line segment (e.g., 592C) may be drawn from an approximate or an exact location of a pin in one virtual cell to another random location in another cell.. Pins or terminals (not shown) along the boundaries of these virtual cells may also be generated as the intersection between the flight-lines and the respective boundary segments. The identifications (e.g., identifiers, names, etc.) of these pins or terminals may also be generated based in part or in whole upon the schematic connectivity information (e.g., the identifications of the pin-outs, the identifications of the corresponding schematic instances, the identifications of the corresponding nets or net segments, other pertinent connectivity information, or any combinations thereof).

FIG. 5E illustrates another example of the detachment process where a group of leaf cells or blocks 504E may be selected, and a real block 502E may be generated based in part or in whole upon a schematic instance that corresponds to the group of leaf cells or blocks 504E. A real or logical (or virtual) hierarchy may also be generated for the real block 502E so that the hierarchical physical design now includes at least the top or highest real hierarchy as well as the real hierarchy generated for the real block 502E. The detachment process usually follows the generation of the boundary 502E of the real block so as to provide an option to further tweak or fine tune the boundary and optionally the pin locations in some embodiments.

The boundary may be generated by tracing the outer edges of the group of leaf blocks or cells 504E with an offset margin determined based on, for example, design rules or constraints in some embodiments or without an offset in some other embodiments. The pins or terminals along the boundary may also be determined as the intersection of the interconnections and the respective boundary segments. The identifications (e.g., identifiers, names, etc.) of these pins or terminals may be similarly determined based in part or in whole upon the schematic connectivity information (e.g., the identifications of the pin-outs, the identifications of the corresponding schematic instances, the identifications of the corresponding nets or net segments, other pertinent connectivity information, or any combinations thereof).

Once a virtual cell is detached from the hierarchical physical design, the hierarchical physical design may appear to include a placeholder for the detached virtual cell in the hierarchical physical design as shown in FIG. 5F. The placeholder may assume the shape 502F (illustrated as a rectilinear shape having the dashed line type in FIG. 5F) of enclosed by the rectilinear boundary of the real cell in some embodiments or a simplified shape 504F (illustrated as a rectangle having the solid line type in FIG. 5F) in some other embodiments. The hierarchical physical design include the placeholder (502F or 504F) may also include the pins or terminals at their respective locations in some embodiments despite the fact that the design details for the real or virtual block or cell have been de-emphasized or hidden in the display. FIG. 5G illustrates the detached virtual cell 502G that corresponds to the placeholder 502F or 504F in FIG. 5F. The detached virtual (or logical) cell 502G includes the leaf cells 510G belonging to this detached virtual (or logical) cell 502G, the pins or terminals 504G, 506G, and 508G located at the interface of the detached virtual (or logical) cell 502G, and the internal interconnects within the boundary of the detached virtual (or logical) cell 502G.

A modification to a block situated at a hierarchical level in the placed and routed hierarchical physical design may be identified at 316. A modification may include an engineering change order (ECO) that is to be implemented after the hierarchical physical design has undergone hierarchical placement and hierarchical routing in some embodiments. For example, an engineering change order may require the addition of a device into a cell situated at a lower hierarchical level in a hierarchical physical design. Conventional approaches for implementing an engineering change order inserts the device design to the highest hierarchical level as illustrated in FIG. 5H.

In FIG. 5H, the hierarchical physical design 502H includes three instances of cells, 504H, 506H, and 508H, at the top or highest real hierarchical level or hierarchy. It shall be noted that the terms "hierarchical level" and "hierarchy" may be used interchangeably throughout the entire Application. The instance of cell 508H further includes another instance 510H at a first lower real hierarchy, and each of instances 504H and 506H also includes some device designs, also at the first lower real hierarchy. The instance of cell 510H also includes some device designs at a second lower real hierarchy. Therefore, the hierarchical physical design includes three real hierarchies—the top or highest real hierarchy, the first lower real hierarchy, and the second real hierarchy. The hierarchical physical design 502H in FIG. 5H further illustrates the respective boundaries that are illustrated as shaded areas for instances 504H, 506H, and 510H.

Assuming an engineering change order (ECO) is to insert another device 512H into the instance of cell 504H, conventional approaches places the instance of cell 512H at the top or highest real hierarchy for the portion of the hierarchical physical design 502H. Once the device 512H is placed in the hierarchical physical design 502H, these conventional approaches may then invoke a routing module to connect the device 512H to the remaining portion of the hierarchical physical design. In the example illustrated in FIG. 5H, the device 512H is connected to three other devices in the instance of cell 504H.

Nonetheless, such conventional approaches may cause issues because the interconnections between device 512H and the instance of cell 504H are created. More specifically, these three interconnects require three terminals or pins 514H for the real or virtual block or cell 504H of the instance of cell 504H. Because the device 512H is inserted at the top or highest real hierarchy, neither the device 512H nor these three terminals or pins 514H belong to the real cell of the instance of cell 504H. That is, the real cell for the instance of cell 504H, when instantiated as another instance, does not include the device 512H or these three pins or terminals.

The detachment and embedment techniques described herein as illustrated in FIG. 5I, on the other hand, first descend into the real cell of the instance of cell 504H, invoke the hierarchical placement module via a function call to place the device 502I (corresponding to the device 512H in FIG. 5H), and invoke the hierarchical routing module via another function call to finish the interconnections 504I between the device 502I and the remaining portion of the real cell of the instance of cell 504H. This cell 504H may again be detached and stored as an object for the real cell that now includes the device 502I as well as the interconnections 504I. In some embodiments, the insertion of an instance 502I may be implemented by descending into instance 504H.

The hierarchical physical design 502H in FIG. 5I also illustrates the respective boundaries that are illustrated as shaded areas for instances 504H, 506H, and 510H. It shall be noted that the boundary for instance 506H in FIG. 5H appears to be different from that for instance 506H in FIG. 5I. This difference may arise when the boundary of instance 506H in FIG. 5H is generated before the hierarchical routing and hence does not encompass the interconnections within instance 506H in FIG. 5H. The boundary of instance 506H in FIG. 5I may be generated after the hierarchical routing and hence encompasses the interconnections within instance 506H in FIG. 5I.

In some embodiments, the boundary of instance 506H in FIG. 5H may be adjusted to become the boundary of instance 506H in FIG. 5I when the hierarchical routing module requires more space to accommodate the interconnections in the instance 506H. In these embodiments, the techniques described herein may invoke, for example, the detachment and embedment module (e.g., 108) to negotiate with one or more other modules (e.g., reference numeral 104) for more space. In some other embodiments, the detachment and embedment module may be invoked to re-generate the boundaries of virtual cells after the hierarchical placement and hierarchical routing have been completed. The virtual cells with may again be detached with the re-generated boundaries.

The detachment and embedment module may also generate the terminals or pins 516H along the respective boundaries of instances 504H, 506H, and 508H. FIG. 5J illustrates the hierarchical physical design 502H after detachment of the three instance, 504H, 506H, and 508H, at the top or highest hierarchical level. As FIG. 5J illustrates, these three instances 504H, 506H, and 508H are respectively represented as placeholders in the hierarchical physical design 502H with the pins and terminals along the boundaries of instances as well as interconnections between these instances. Each placeholder may assume the boundary of the cell that the placeholder represents in some embodiments. In some other embodiments, a placeholder may have a simplified outer geometry or shape.

It shall be noted that although FIGS. 5H and 5I illustrate the two instances 512H and 502I being inserted at two different locations, the locations at which these two instances are respectively inserted carry less significance than at which hierarchy level or in which particular instance these two instances are respectively inserted. Therefore, although instance 512H and instance 502I may appear to be inserted at two different locations in the hierarchical physical design 502H, these two different locations are illustrated in FIGS. 5H-I for the sole or primary purpose of each of explanations and illustration and are not intended to limit the scope of the claims or the scope of other embodiments, unless otherwise explicitly recited.

As described in the respective description of FIGS. 5H-I, FIG. 5H illustrates the insertion of instance 512H at the top or highest hierarchical level. In some embodiments, FIG. 5I illustrates descending into the first lower real hierarchy at which instance 502I is located, invoking a design implementation tool or a design implementation suite via an inter-process call or a function call to access the master of the instance 502I, and implementing the ECO for the master of instance 502I. In these embodiments, all instances instantiated from the master will also be updated. In some other embodiments, FIG. 5I illustrates descending into the first lower real hierarchy at which instance 502I is located, invoking a design implementation tool or a design implementation suite via an inter-process call or a function call to access the instance 502I, implementing the ECO for the instance 502I, and dissociating instance 502I from its original master. In these embodiments, the other instances instantiated from the original master will not be affected by the ECO implemented in the instance 502I alone.

Referring back to FIG. 3B, the real cell in which the modification is to be implemented may be identified at 318. The real cell may be embedded at 320 back into the hierarchical physical design in some embodiments where the virtual cell has been detached and represented as a placeholder in the hierarchical physical design. The physical implementation modules may then descend to the embedded real cell at the hierarchical level, instead of the top or highest hierarchical level as conventional approaches do, at 322B and then to implement the modification at 324 to the real cell at the correct hierarchical level.

A plurality of leaf cells may be identified at 326 for the hierarchical physical design. The physical implementation modules may then ascend to a higher hierarchical level, if necessary, in the hierarchical physical design at 328 to further implement one or more other modifications at this higher hierarchical level. For example, the modification implemented at 324 may affect the design at one or more higher hierarchical levels in some embodiments. In these embodiments, the physical implementation modules may ascend to these one or more higher hierarchical levels to effect the changes in order to fully accommodate the modification identified at 316.

The modified, embedded virtual cell including the implemented modification may be optionally detached at 330 and represented as the original placeholder or a different placeholder if the modification also changes the boundary of the virtual cell. The hierarchical placement and/or the hierarchical routing may also be optionally improved at 332 by adjusting the results of hierarchical placement and/or routing. For example, one or more rotations and/or movements may be applied to one or more leaf cells; one or more pairs of leaf cells may be swapped; interconnects may be re-routed; etc. in some embodiments.

One or more physical design databases may be identified (if already existing and current), generated (if not yet existing), or updated (if not current) at 334 for the hierarchical physical design. Various pieces of information may be appended at 336 to a hierarchical netlist and/or a flat netlist of the hierarchical physical design. For example, physical connectivity data and/or electrical parasitic information may be appended to a hierarchical netlist and/or a flat netlist of the hierarchical physical design in some embodiments. These one or more physical design databases, the hierarchical netlist, and/or the flat netlist may be further used for further analyses or simulations. At 338, the hierarchical physical design may be analyzed by using at least the one or more physical design databases, the hierarchical netlist, and/or the flat netlist, rather than just the flat netlist as most SPICE (Simulation Program with Integrated Circuit Emphasis), SPICE-equivalent, or SPICE-like simulators require.

Figure 4A:
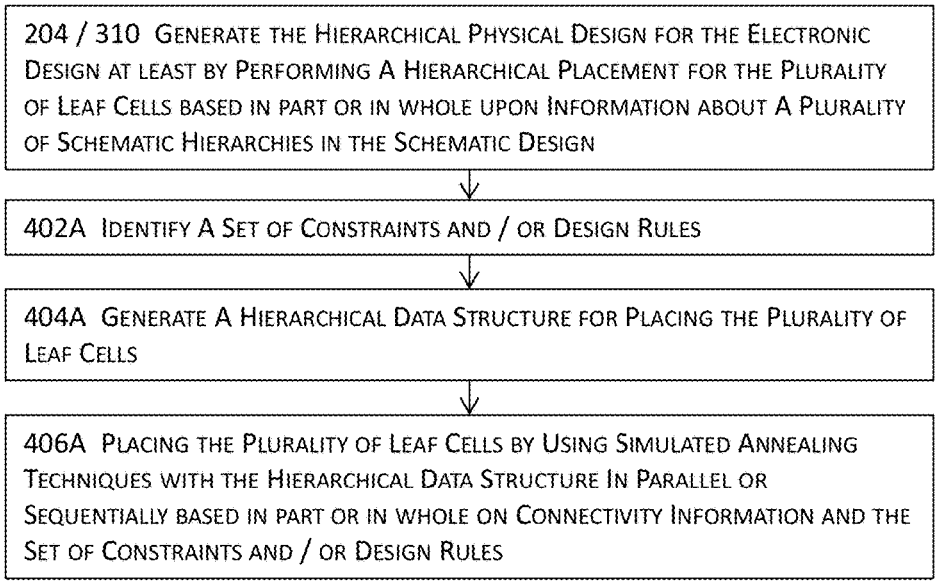
FIG. 4A illustrates more details about generating a hierarchical physical design by performing a hierarchical placement for a plurality of leaf cells as illustrated in FIGS. 2 and 3A in some embodiments.

FIG. 4A illustrates more details about generating a hierarchical physical design by performing a hierarchical placement for a plurality of leaf cells or blocks as illustrated in FIGS. 2 and 3A in some embodiments. More specifically, FIG. 4A illustrates a hierarchical placement process that involves constructing and traversing a tree structure (e.g., a B*-tree) and packing placed leaf blocks to hierarchically place a plurality of cells. In these embodiments, generating a hierarchical physical design by performing a hierarchical placement for a plurality of leaf cells or blocks may include an act of identifying a set of constraints and/or design rules at 402A.

The set of constraints or design rules may include, for example, a common-centroid constraint or design rule governing two or more groups of leaf cells (e.g., a current mirror, a differential pair, etc.) that are to be placed with respect to a common centroid to reduce or minimize mismatches among these devices. The set of constraints or design rules may include, for example, a symmetry constraint or design rule to place leaf cells symmetrically with respect to a common axis to reduce parasitic mismatch, circuit sensitivity due to thermal gradients, process variations for devices, etc.

The set of constraints or design rules may include, for example, a proximity constraint or design rule that requires certain leaf cells or groups of leaf cells to be placed within some close proximity. The set of constraints or design rules may include, for example, an abutment constraint or design rule that requires two leaf cells or two groups of leaf cells be abutted against each other. The set of constraints or design rules may include, for example, a hierarchical symmetry constraint or design rule that require leaf cells or groups of leaf cells be placed symmetrically with respect to respective axis in two or more child hierarchies that are further placed symmetrically with respect to another axis in their parent hierarchy. The set of constraints or design rules may include, for example, a hierarchical proximity constraint or design rule that requires leaf cells or virtual cells be placed within certain proximity across hierarchies.

A hierarchical data structure may be generated at 404A for placing the plurality of leaf cells in the hierarchical physical design. In some embodiments, the hierarchical data structure may include, for example, a B*-tree that represents a compacted placement of the plurality of leaf cells where every leaf cell cannot move toward the left and bottom. A node in the B*-tree corresponds to a leaf cell in the placement. The root of the B*-tree corresponds to the leaf cell in the bottom-left corner. The nodes (representing leaf cells) in the B*-tree may be labeled from left to right and again from bottom to top based in part or in whole upon the connectivity information among the plurality of leaf cells.

Simulated annealing techniques may be utilized to place the plurality of cells at 406A in the hierarchical physical design based in part or in whole upon the set of constraints or design rules identified at 402A. Hierarchical cells (e.g., a virtual cell having more than one hierarchy) and non-hierarchical cells (e.g., leaf cells not belonging to any other parent cells or blocks) may be placed in parallel in some embodiments. The placement result may be optionally optimized by, for example, applying rotation and/or movement to one or more leaf cells and/or one or more virtual cells in some embodiments. In addition or in the alternative, placement result may be optionally optimized by, for example, swapping cells and/or by swapping real or virtual cells in the hierarchical physical design.

Figure 4B:
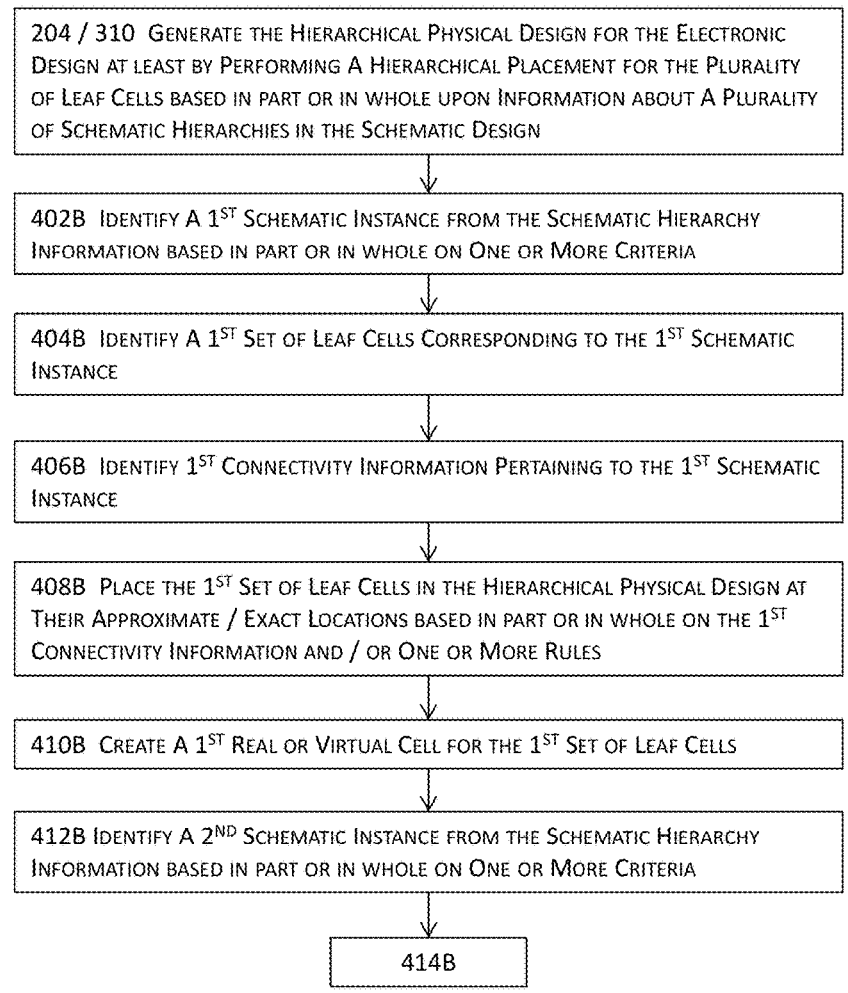
FIGS. 4B-C jointly illustrate more details about generating a hierarchical physical design by performing a hierarchical placement for a plurality of leaf cells as illustrated in FIGS. 2 and 3A in some embodiments.
Figure 4C:
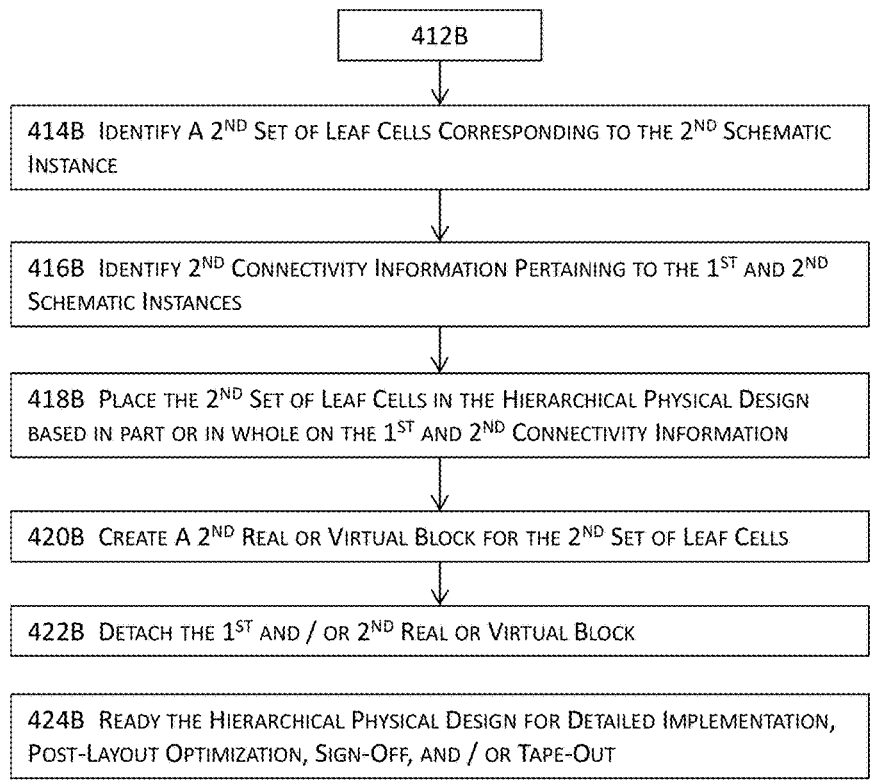

FIGS. 4B-C jointly illustrate more details about generating a hierarchical physical design by performing a hierarchical placement for a plurality of leaf cells or blocks as illustrated in FIGS. 2 and 3A in some embodiments. In these one or more embodiments, a first schematic instance may be identified at 402B from the schematic hierarchy information of the corresponding schematic design based in part or in whole upon one or more criteria. These one or more criteria may include, for example, ranks, orders, or priorities among the schematic instances in the schematic design where a schematic instance at a higher schematic hierarchy assumes a higher order, rank, or priority and may thus be identified before another schematic instance having a lower rank, order, or priority. These one or more criteria may also include whether a schematic instance is connected to a power rail, a power stripe, or a ground where a schematic instance connected to a power rail, a power stripe, or a ground may be identified before another schematic instance that is not.

A first set of leaf cells corresponding to the first schematic instance may be identified at 404B from, for example, a set, a library, or a database of leaf cells. To the extent that a leaf cell is unavailable for a schematic device (e.g., a new cell that has not been used before) for a block of circuit component designs, such a leaf cell may be identified by referencing one or more prior similar cells that exhibit similar functions and/or structures and may be modified to form the leaf cell of interest in some embodiments. In some other embodiments, an unavailable leaf cell may be identified by estimating the size, shape, and/or the number and locations of connections based in part or in whole upon the pertinent connectivity information of this unavailable leaf cell with respect to one or more other leaf cells or circuit component designs.

First connectivity information pertaining to the first schematic instance may be identified at 406B from the schematic connectivity information. The first connectivity information may include the connectivity information (e.g., the names or identifications of nets, net segments, pins, terminals, etc.) for the devices within the first schematic instance and/or between the first schematic instance and one or more other schematic instances. The first set of leaf cells may be optionally placed at 408B at their approximate and/or exact locations based in part or in whole upon the first connectivity information and/or one or more design rules or constraints.

These one or more design rules or constraints may include one or more constraints or design rules described above with reference to FIG. 4A in some embodiments. These one or more design rules or constraints may further include a constraint or design rule that requires minimization or reduction of area utilization, a constraint or design rule that requires minimization or reduction of wire lengths, a spacing design rule or constraint, any other suitable design rules or constraints, etc. In these embodiments illustrated in 408B, leaf cells are hierarchical placed after the identification of the set of leaf cells corresponding to the first schematic instance. In some embodiments, placement is not performed until all the leaf cells (at least for a portion of the design such as an analog island or a digital portion) have been identified into the hierarchical physical design.

A first virtual cell may be created at 410B for the first set of leaf cells in some embodiments. In some other embodiments, virtual cells are created after the hierarchical placement and hierarchical routing because the placement locations and the routed interconnections are less likely to change.

A second schematic instance may be identified at 412B from the schematic hierarchy information of the corresponding schematic design based in part or in whole upon one or more criteria. These one or more criteria may include, for example, whether the second schematic instance is connected to the first schematic instance identified at 402B, the number of connections between the second schematic instance and the identified first schematic instance, the distance between the second schematic instance and the identified first instance, or any other suitable criteria. For example, a schematic instance that is connected to the identified first schematic instance may be identified before another schematic instance that is not connected to the identified first schematic instance; a schematic instance that is closer to the identified first schematic instance may be identified before another schematic instance that is further away from the identified first schematic instance; and a schematic instance that has more connections to the identified first schematic instance may be identified before another schematic instance that has fewer connections to the identified first schematic instance in some embodiments.

A second set of leaf cells corresponding to the first schematic instance may be identified at 414B from, for example, the set, a library, or a database of leaf cells from which the first set of leaf cells is also identified. Similar to the first set of leaf cells, if a leaf cell is unavailable for a schematic device (e.g., a new cell that has not been used before) for a block of circuit component designs, such a leaf cell may be identified or created by referencing one or more prior similar cells that exhibit similar functions and/or structures and may be modified to form the leaf cell of interest in some embodiments. In some other embodiments, an unavailable leaf cell may be identified by estimating the size, shape, and/or the number and locations of connections based in part or in whole upon the pertinent connectivity information of this unavailable leaf cell with respect to one or more other leaf cells or circuit component designs.

Second connectivity information pertaining to the first schematic instance may be identified at 416B from the schematic connectivity information. The second connectivity information may also include the connectivity information comprising, for example, the names or identifications of nets, net segments, pins, terminals, etc. for the devices within the second schematic instance and/or between the second schematic instance and one or more other schematic instances. The second set of leaf cells may be optionally placed at 418B at their approximate and/or exact locations based in part or in whole upon the second connectivity information and/or one or more design rules or constraints.

These one or more design rules or constraints may include one or more constraints or design rules described above with reference to FIG. 4A, a constraint or design rule that requires minimization or reduction of area utilization, a constraint or design rule that requires minimization or reduction of wire lengths, a spacing design rule or constraint, any other suitable design rules or constraints, or any combinations thereof. In these embodiments illustrated in 418B, leaf cells are hierarchical placed after the identification of the second set of leaf cells corresponding to the second schematic instance. In some embodiments, placement is not performed until all the leaf cells (at least for a portion of the design such as an analog island or a digital portion) have been identified into the hierarchical physical design.

A second virtual cell may be created at 420B for the second set of leaf cells in some embodiments. In some other embodiments, virtual cells may be created after the hierarchical placement and hierarchical routing because the placement locations and the routed interconnections are less likely to change. One or more virtual cells may be detached at 422B. In some embodiments, detachment of virtual cells may be performed after the hierarchical placement, the hierarchical routing, and/or the boundary generation have been performed to provide the option to further tweak or fine tune these virtual cells before detachment. In some other embodiments, detachment may be performed prior to the performance of the hierarchical routing or the hierarchical placement although the detached virtual cells may be further modified to accommodate subsequent changes made by the hierarchical routing and/or the hierarchical placement. After the hierarchical placement and hierarchical routing, the hierarchical physical design may be readied at 424B for detailed implementation, post-layout optimization, post-layout analyses and simulations, sign-off, and/or tape-out for manufacturing.

Figure 4D:
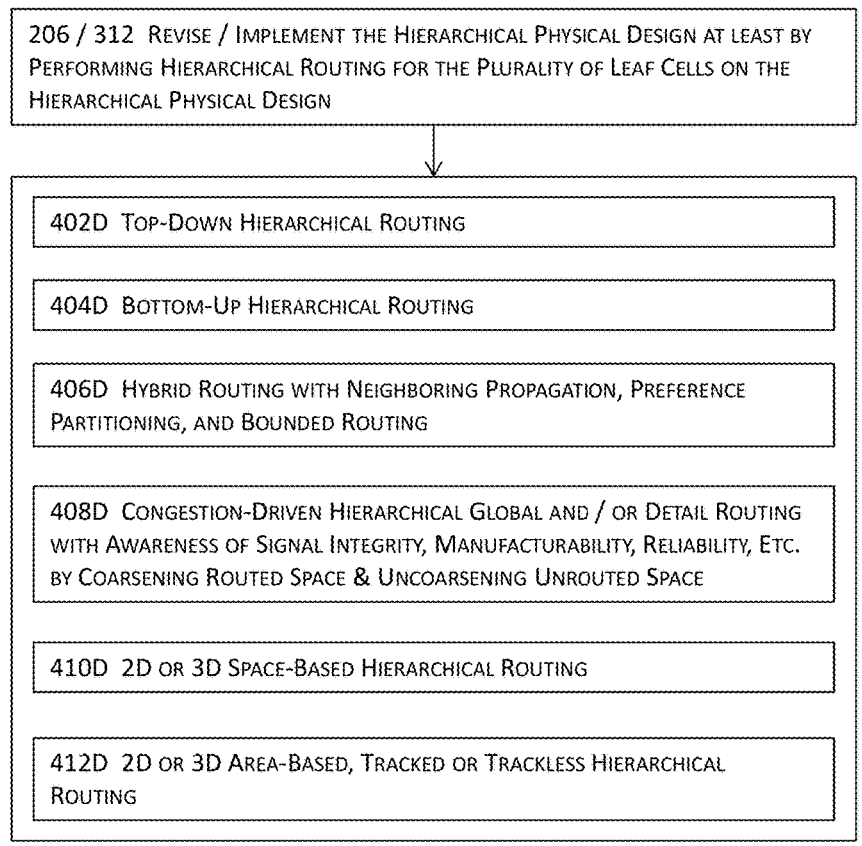
FIG. 4D illustrates more details about implementing or revising a hierarchical physical design by performing hierarchical routing as illustrated in FIGS. 2 and 3A in some embodiments.

FIG. 4D illustrates more details about implementing or revising a hierarchical physical design by performing hierarchical routing as illustrated in FIGS. 2 and 3A in some embodiments. In these embodiments, various techniques may be utilized to perform hierarchical routing for the hierarchical physical design. For example, a top-down hierarchical routing technique 402D that begins with partitioning a larger region into a series of smaller sub-regions and proceeds from the highest hierarchy may be used to route the hierarchical physical design in some embodiments. A bottom-up hierarchical routing technique 404D that also begins with partitioning a larger region into a series of smaller sub-regions and proceeds from the lowest hierarchy may be used to route the hierarchical physical design in some embodiments.

A hybrid routing technique 406D utilizing neighboring propagation, preference partitioning, and bounded routing may also be used to partition a larger region into a series of smaller sub-regions and route the hierarchical physical design in some embodiments. In these embodiments, bounded maze routing may be first performed by propagating a user-defined number of circles of waves out to each pin. If viable connections are not found, the pins and blockages (if any) may be recursively mapped onto the adjacent upper level; and a bounded maze routing module may be called to search for a viable routing solution. Once a connection is determined, the connection may then be mapped back to the lower level, and a routing solution may be determined.

A congestion-driven hierarchical global and/or detail routing methodology 408D may also be utilized to route the hierarchical physical design in some embodiments. In some of these embodiments, the congestion-driven hierarchical routing module may also be made aware the manufacturability requirements (e.g., the OPC or optical proximity correction requirements, the CMP or chemical mechanical polishing requirements, etc.), the reliability requirements, the signal integrity requirements, other suitable requirements, or any combinations thereof so that the routing result satisfies these requirements.

With the congestion-driven hierarchical routing, global and/or detailed routing may be performed for nets by coarsening the routed space. Routing congestion may be estimated for the next level, and analysis-driven (e.g., crosstalk-driven or other types of analyses-driven) layer or track assignment may be performed for long interconnect segments while short interconnect segments may be routed by, for example, point-to-path maze routing module. Failed nets or net segments may be re-routed by using, for example, point-to-path routing module or other types of routing modules; and the routing solution may be iteratively refined by un-coarsening or refining the non-routed space.

A two-dimension space-based hierarchical routing module 410D may also be used to route the hierarchical physical design in some embodiments. In some other embodiments, a three-dimension space-based hierarchical routing module 410D may also be used to route the hierarchical physical design. These two-dimensional or three-dimension space-based hierarchical routing modules use space-based (or area-based) search probes to guide a router (e.g., a point-to-point router that routes an interconnect between two points in the design) to perform area search for viable routing solutions for a hierarchical physical design.

A space-based search probe 412D may be used to store information such as information about routing the interconnections (e.g., destination location, beginning location, etc.) in some embodiments. Any areas including degenerated areas such as line segments may be used as space-based search probes. Moreover, these two-dimension and three-dimensional space-based routing modules may be tracked (having horizontal or vertical tracks but not both), gridded (having both horizontal and vertical routing tracks), gridless (having vertical but not horizontal routing tracks or having horizontal but no vertical routing tracks), or trackless (having no horizontal or vertical routing tracks). Characteristics, attributes, requirements, constraints, and/or design rules for electrical, parasitic, manufacturability, reliability, signal integrity, etc. may also be built into these space-based routing modules such that the routing results satisfy these requirements, constraints, or design rules.

System Architecture Overview

Figure 6:
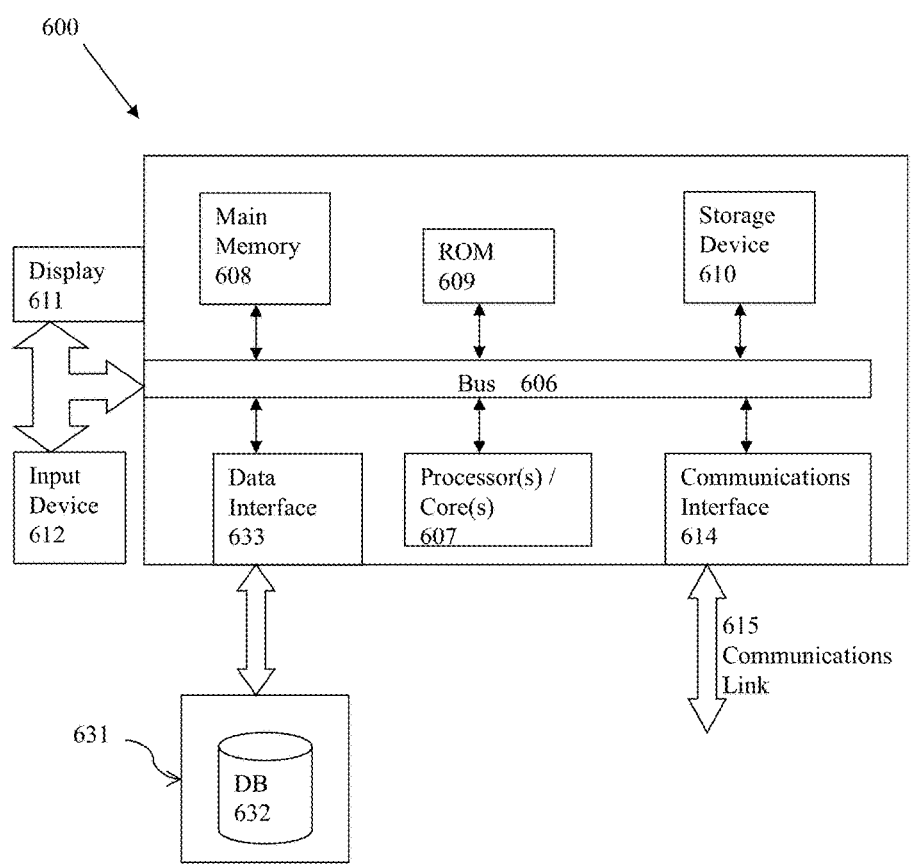
FIG. 6 illustrates a computerized system on which a method for implementing virtual prototyping for electronic designs may be implemented.

FIG. 6 illustrates a block diagram of a simplified illustration of a computing system 600 suitable for FIG. 6 illustrates a computerized system on which a method for implementing virtual prototyping for electronic designs as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computer system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, the acts of determination, extraction, stitching, simulating, annotating, analyzing, optimizing, and/or identifying, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program (e.g., application code) through communication link 615 and communication interface 614. Received program code may be executed by processor 607 as it is received, and/or stored in disk drive 610, or other non-volatile storage for later execution. In an embodiment, the computer system 600 operates in conjunction with a data storage system 631, e.g., a data storage system 631 that includes a database 632 that is readily accessible by the computer system 600. The computer system 600 communicates with the data storage system 631 through a data interface 633. A data interface 633, which is coupled to the bus 606 (e.g., memory bus, system bus, data bus, etc.), transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing virtual prototyping for electronic designs, comprising:
   identifying a plurality of leaf cells of an electronic design to be implemented in a hierarchical physical design of the electronic design;
   implementing, at one or more physical implementation modules stored at least partially in memory of one or more computing systems and including or functioning in conjunction with at least one hardware processor of the one or more computing systems, the hierarchical physical design for the electronic design at least by performing hierarchical placement for the plurality of leaf cells based in part or in whole upon one or more factors;
   determining an implementation solution for the hierarchical physical design at least by confining deviations of pins or boundaries from respective nominal values in the hierarchical physical design, confining the deviations of the pins or the boundaries in the hierarchical physical design comprising:
      determining at least one pin location for a leaf cell of the plurality of leaf cells based at least in part upon a boundary of the leaf cell;
      performing hierarchical routing for the plurality of leaf cells on the hierarchical physical design prior to detachment of the leaf cell based in part or in whole upon the hierarchical placement and the at least one pin location; and
      generating an updated hierarchical physical design at least by revising the hierarchical physical design for the electronic design based at least in part upon the hierarchical routing; and
   causing fabrication of a version of the updated hierarchical physical design on semiconductor fabrication equipment with one or more photomasks, wherein the one or more photomasks fabricated with the version of the updated hierarchical physical design.

2. The computer implemented method of claim 1, the process further comprising:
   detaching a real or virtual cell in the hierarchical physical design at least by grouping a first set of leaf cells in the plurality of leaf cells and representing the first set of leaf cells with a first placeholder.

3. The computer implemented method of claim 1, the one or more factors comprising hierarchy information about a plurality of schematic hierarchies in a schematic design.

4. The computer implemented method of claim 1, the process further comprising:
   identifying a schematic design of the electronic design;
   identifying connectivity information from the schematic design of the electronic design; and
   identifying a plurality of schematic hierarchies and a plurality of schematic instances at one or more of the plurality of schematic hierarchies.

5. The computer implemented method of claim 1, the process further comprising:
   identifying a modification to the hierarchical physical design; and
   identifying a cell in which the modification is to be implemented in a real or virtual hierarchy in hierarchical physical design.

6. The computer implemented method of claim 5, the process further comprising:
   embedding the cell back at a location of a placeholder for the cell in the hierarchical physical design; and
   descending into the cell at the real or virtual hierarchy in the hierarchical physical design.

7. The computer implemented method of claim 6, the process further comprising:
   generating a modified cell at least by implementing the modification in the cell embedded into the hierarchical physical design; and
   detaching the modified cell at least by representing the modified cell as the placeholder or a modified placeholder.

8. The computer implemented method of claim 1, the process further comprising:
   identifying, generating, or updating one or more physical design databases storing thereupon design data of the hierarchical physical design;
   appending physical connectivity data and/or electrical parasitic information obtained from the hierarchical physical design and/or the one or more physical design databases to a hierarchical netlist and/or a flat netlist; and
   analyzing the hierarchical physical design by using at least the one of the one or more physical design databases and the hierarchical netlist as inputs to one or more simulation modules.

9. The computer implemented method of claim 1, the process further comprising:
   identifying a set of constraints or design rules;
   generating a hierarchical data structure for the hierarchical placement for the plurality of leaf cells; and
   performing the hierarchical placement for the plurality of leaf cells by using at least the hierarchical data structure based in part or in whole upon the set of constraints or design rules.

10. The computer implemented method of claim 1, the process further comprising:
    identifying a first schematic instance from schematic hierarchy information based in part or in whole upon one or more first criteria;
    identifying a first set of leaf cells corresponding to the first schematic instance from the plurality of leaf cells; and
    identifying first connectivity information pertaining to the first schematic instance.

11. The computer implemented method of claim 10, the process further comprising:
    identifying a second schematic instance from the schematic hierarchy information based in part or in whole upon one or more second criteria;
    identifying a second set of leaf cells corresponding to the second schematic instance from the plurality of leaf cells;

identifying second connectivity information pertaining to the second schematic instance; and performing the hierarchical placement for the first and second sets of leaf cells and for the plurality of leaf cells in the hierarchical physical design based in part or in whole upon the first connectivity information and the second connectivity information.

12. The computer implemented method of claim 11, wherein the one or more first criteria include at least one of ranks, orders, or priorities of a plurality of schematic instances in a schematic design of the hierarchical physical design, a determination of whether the first schematic instance is connected to a power rail, a power stripe, or a ground rail, or any combinations thereof, and the one or more second criteria comprise at least one of a determination of whether the second schematic instance is connected to the first schematic instance, a number of connections between the first schematic instance and the second schematic instance, a distance between the first schematic instance and the second schematic instance, or any combinations thereof.

13. A system for implementing a simulation platform with dynamic device model libraries, comprising:
  non-transitory computer accessible storage medium storing thereupon program code;
  at least one processor executing the program code to identify a plurality of leaf cells of an electronic design to be implemented into a hierarchical physical design of the electronic design;
  one or more physical implementation modules that are stored at least partially in memory of one or more computing systems, include or function in conjunction with at least one hardware processor of the one or more computing systems, and are configured to execute the program code to implement the hierarchical physical design for the electronic design at least by performing hierarchical placement for the plurality of leaf cells based in part or in whole upon one or more factors;
  the at least one processor further executing the program code to determine an implementation solution for the hierarchical physical design at least by confining deviations of pins or boundaries from respective nominal values in the hierarchical physical design, wherein the at least one processor configured to confine the deviations of the pins or the boundaries in the hierarchical physical design is further configured to:
    determine at least one pin location for a leaf cell of the plurality of leaf cells based at least in part upon a boundary of the leaf cell perform hierarchical routing for the plurality of leaf cells on the hierarchical physical design prior to detachment of the leaf cell based in part or in whole upon the hierarchical placement and the at least one pin location; and
    generate an updated hierarchical physical design at least by revising the hierarchical physical design for the electronic design based at least in part upon the hierarchical routing; and
  causing fabrication of a version of the updated hierarchical physical design on semiconductor fabrication equipment with one or more photomasks, wherein the one or more photomasks fabricated with the version of the updated hierarchical physical design.

14. The system for claim 13, the at least one processor further executing the program code to detach a virtual cell in the hierarchical physical design at least by grouping a first set of leaf cells in the plurality of leaf cells and representing the first set of leaf cells with a first place holder.

15. The system for claim 13, the at least one processor further executing the program code to identify a schematic design of the electronic design, to identify connectivity information from the schematic design of the electronic design, and to identify a plurality of schematic hierarchies and a plurality of schematic instances at one or more of the plurality of schematic hierarchies.

16. The system for claim 13, the at least one processor further executing the program code to identify a modification to the hierarchical physical design, to identify a cell in which the modification is to be implemented in a real hierarchy in hierarchical physical design, to embed the cell back at a location of a placeholder for the cell in the hierarchical physical design, to descend into the cell at the real hierarchy in the hierarchical physical design, to generate a modified cell at least by implementing the modification in the cell embedded into the hierarchical physical design, and to detach the modified cell at least by representing the modified cell as the placeholder or a modified placeholder.

17. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing virtual prototyping for electronic designs, the set of acts comprising:
  identifying a plurality of leaf cells of an electronic design to be implemented into a hierarchical physical design of the electronic design;
  implementing, at one or more physical implementation modules stored at least partially in memory of one or more computing systems and including or functioning in conjunction with at least one hardware processor of the one or more computing systems, the hierarchical physical design for the electronic design at least by performing hierarchical placement for the plurality of leaf cells based in part or in whole upon one or more factors;
  determining an implementation solution for the hierarchical physical design at least by confining deviations of pins or boundaries from respective nominal values in the hierarchical physical design, confining the deviations of the pins or the boundaries in the hierarchical physical design comprising:
    determining at least one pin location for a leaf cell of the plurality of leaf cells based at least in part upon a boundary of the leaf cell;
    performing hierarchical routing for the plurality of leaf cells on the hierarchical physical design prior to detachment of the leaf cell based in part or in whole upon the hierarchical placement and the at least one pin location; and
    revising the hierarchical physical design for the electronic design based at least in part upon the hierarchical routing; and
  causing fabrication of a version of the updated hierarchical physical design on semiconductor fabrication equipment with one or more photomasks, wherein the one or more photomasks fabricated with the version of the updated hierarchical physical design.

18. The article of manufacture of claim 17, the set of acts further comprising:
  identifying, generating, or updating one or more physical design databases storing thereupon design data of the hierarchical physical design;

appending physical connectivity data and/or electrical parasitic information obtained from the hierarchical physical design and/or the one or more physical design databases to a hierarchical netlist and/or a flat netlist; and analyzing the hierarchical physical design by using at least the one of the one or more physical design databases and the hierarchical netlist as inputs to one or more simulation modules.

19. The article of manufacture of claim 17, the set of acts further comprising:

identifying a set of constraints or design rules;

generating a hierarchical data structure for the hierarchical placement for the plurality of leaf cells; and performing the hierarchical placement for the plurality of leaf cells by using at least the hierarchical data structure based in part or in whole upon the set of constraints or design rules.

20. The article of manufacture of claim 17, the set of acts further comprising:

identifying a first schematic instance from schematic hierarchy information based in part or in whole upon one or more first criteria;

identifying a first set of leaf cells corresponding to the first schematic instance from the plurality of leaf cells;

identifying first connectivity information pertaining to the first schematic instance;

identifying a second schematic instance from the schematic hierarchy information based in part or in whole upon one or more second criteria;

identifying a second set of leaf cells corresponding to the second schematic instance from the plurality of leaf cells;

identifying second connectivity information pertaining to the second schematic instance; and performing the hierarchical placement for the first and second sets of leaf cells and for the plurality of leaf cells in the hierarchical physical design based in part or in whole upon the first connectivity information and the second connectivity information.

* * * * *